US012616046B2

(12) United States Patent
Sung et al.

(10) Patent No.: US 12,616,046 B2
(45) Date of Patent: Apr. 28, 2026

(54) WAFER BONDING INCORPORATING THERMAL CONDUCTIVE PATHS

(71) Applicant: Taiwan Semiconductor Manufacturing Co., Ltd., Hsinchu (TW)

(72) Inventors: Su-Jen Sung, Zhubei City (TW); Guan-Yao Tu, Hsinchu (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 658 days.

(21) Appl. No.: 17/651,665

(22) Filed: Feb. 18, 2022

(65) Prior Publication Data

US 2023/0154837 A1      May 18, 2023

Related U.S. Application Data

(60) Provisional application No. 63/264,194, filed on Nov. 17, 2021.

(51) Int. Cl.
*H01L 23/498* (2006.01)
*H01L 21/48* (2006.01)
*H01L 23/367* (2006.01)

(52) U.S. Cl.
CPC .... *H01L 23/49822* (2013.01); *H01L 21/4857* (2013.01); *H01L 23/367* (2013.01)

(58) Field of Classification Search
CPC ....... H01L 25/0652; H01L 2224/83948; H01L 2224/83895; H01L 2224/83896; H01L 2224/83894; H01L 2224/08145; H01L 2224/80895; H01L 2224/80896; H01L 24/05; H01L 24/08; H01L 24/80;
(Continued)

(56) References Cited

U.S. PATENT DOCUMENTS 11,923,234 B2 * 3/2024 Fallourd ........... H01L 21/76224
2013/0037960 A1 * 2/2013 Sadaka ................... H01L 24/97
257/774
(Continued)

FOREIGN PATENT DOCUMENTS

TW            202139353 A      10/2021

*Primary Examiner* — Jessica S Manno
*Assistant Examiner* — Victor Joseph Lasasso
(74) *Attorney, Agent, or Firm* — Slater Matsil, LLP

(57) ABSTRACT

A method includes forming a first bond layer on a first wafer, and forming a first thermal conductive channel extending into the first bond layer. The first thermal conductive channel has a first thermal conductivity value higher than a second thermal conductivity value of the first bond layer. The method further includes forming a second bond layer on a second wafer, and forming a second thermal conductive channel extending into the second bond layer. The second thermal conductive channel has a third thermal conductivity value higher than a fourth thermal conductivity value of the second bond layer. The first wafer is bonded to the second wafer, and the first thermal conductive channel at least physically contacts the second thermal conductive channel. An interconnect structure is formed over the first wafer. The interconnect structure is electrically connected to integrated circuit devices in the first wafer.

20 Claims, 28 Drawing Sheets

(58) Field of Classification Search
CPC ....... H01L 25/0657; H01L 2224/08146; H01L
2224/80357; H01L 2924/00012
See application file for complete search history.

(56) References Cited

U.S. PATENT DOCUMENTS

| | | | |
|---|---|---|---|
| 2014/0263959 A1* | 9/2014 | Hsu ........................ | H04N 25/79 |
| | | | 250/206 |
| 2015/0279888 A1* | 10/2015 | Chen ....................... | H10F 39/18 |
| | | | 257/459 |
| 2018/0158749 A1* | 6/2018 | Yu ........................... | H01L 24/08 |
| 2020/0006266 A1* | 1/2020 | Chen .................. | H01L 23/5283 |
| 2020/0161263 A1* | 5/2020 | Chen ................. | H01L 23/49827 |
| 2023/0048311 A1* | 2/2023 | Bhushan ................. | H01L 24/29 |

* cited by examiner

WAFER BONDING INCORPORATING THERMAL CONDUCTIVE PATHS

PRIORITY CLAIM AND CROSS-REFERENCE

This application claims the benefit of the following provisionally filed U.S. Patent application: Application No. 63/264,194, filed on Nov. 17, 2021, and entitled "High Thermal Conducting Wafer Bonding," which application is hereby incorporated herein by reference.

BACKGROUND

Carrier wafers are commonly used in the packaging of integrated circuits as a supporting mechanism. For example, when forming a device wafer with through-vias penetrating through a substrate of the device wafer, the device wafer is bonded to a carrier wafer, so that the device wafer may be thinned, and electrical connectors may be formed on the backside of the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
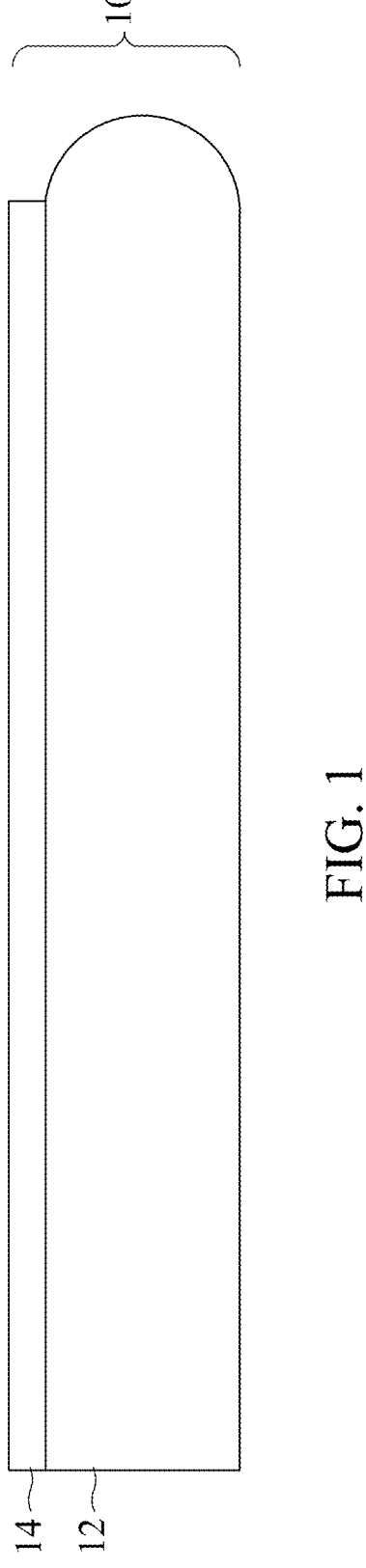
FIGS. 1-16 illustrate the intermediate stages in a wafer bonding process and the formation of thermal conductive channels in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer bonding process and the formation of thermal conductive channels in the wafers are provided. In accordance with some embodiments of the present disclosure, a device wafer is bonded to a carrier wafer. Thermal conductive channels are formed in both of the device wafer and the carrier wafer. The device wafer is bonded to the carrier wafer, with the thermal conductive channels in the device wafer and the thermal conductive channels in the carrier wafer bonded to each other. The device wafer may be cut into device dies. The heat generated in the device die may be conducted through the thermal conductive channels. Accordingly, the thermal conductivity of the resulting package is improved. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-16 illustrate the cross-sectional views of intermediate stages in the bonding of a device wafer to a carrier wafer, and the formation of a backside interconnect structure on the backside of the device wafer in accordance with some embodiments of the present disclosure. The corresponding processes are also reflected schematically in the process flow shown in FIG. 28.

Referring to FIG. 1, wafer 10 is formed. In accordance with some embodiments, wafer 10 is a carrier wafer that has no active devices (such as transistors) and passive devices therein, and hence is referred to as carrier wafer 10 hereinafter. Carrier wafer 10 may have a round top view shape. In accordance with some embodiments, carrier wafer 10 includes substrate 12. Substrate 12 may be formed of a same material as the substrate 32 in device wafer 30 (FIG. 4), so that in the subsequent packaging process, the warpage due to the mismatch of Coefficients of Thermal Expansion (CTE) values between carrier wafer 10 and device wafer 30 is reduced. Substrate 12 may be formed of or comprise silicon, while other materials such as ceramic, glass, silicate glass, or the like, may also be used. In accordance with some embodiments, the entire substrate 12 is formed of a homogeneous material, with no other material different from the homogeneous material therein. For example, the entire carrier wafer 10 may be formed of silicon (doped or undoped), and there is no metal region, dielectric region, etc., therein.

In accordance with alternative embodiments, wafer 10 is a device wafer including active devices (such as transistors) and/or passive devices (such as capacitors, resistors, inductors, and/or the like) therein. Wafer 10, when being a device wafer, may be an un-sawed wafer including a semiconductor substrate continuously extending into all device dies in the wafer, or may be a reconstructed wafer including discrete device dies that are packaged in an encapsulant (such as a molding compound).

Figure 28:
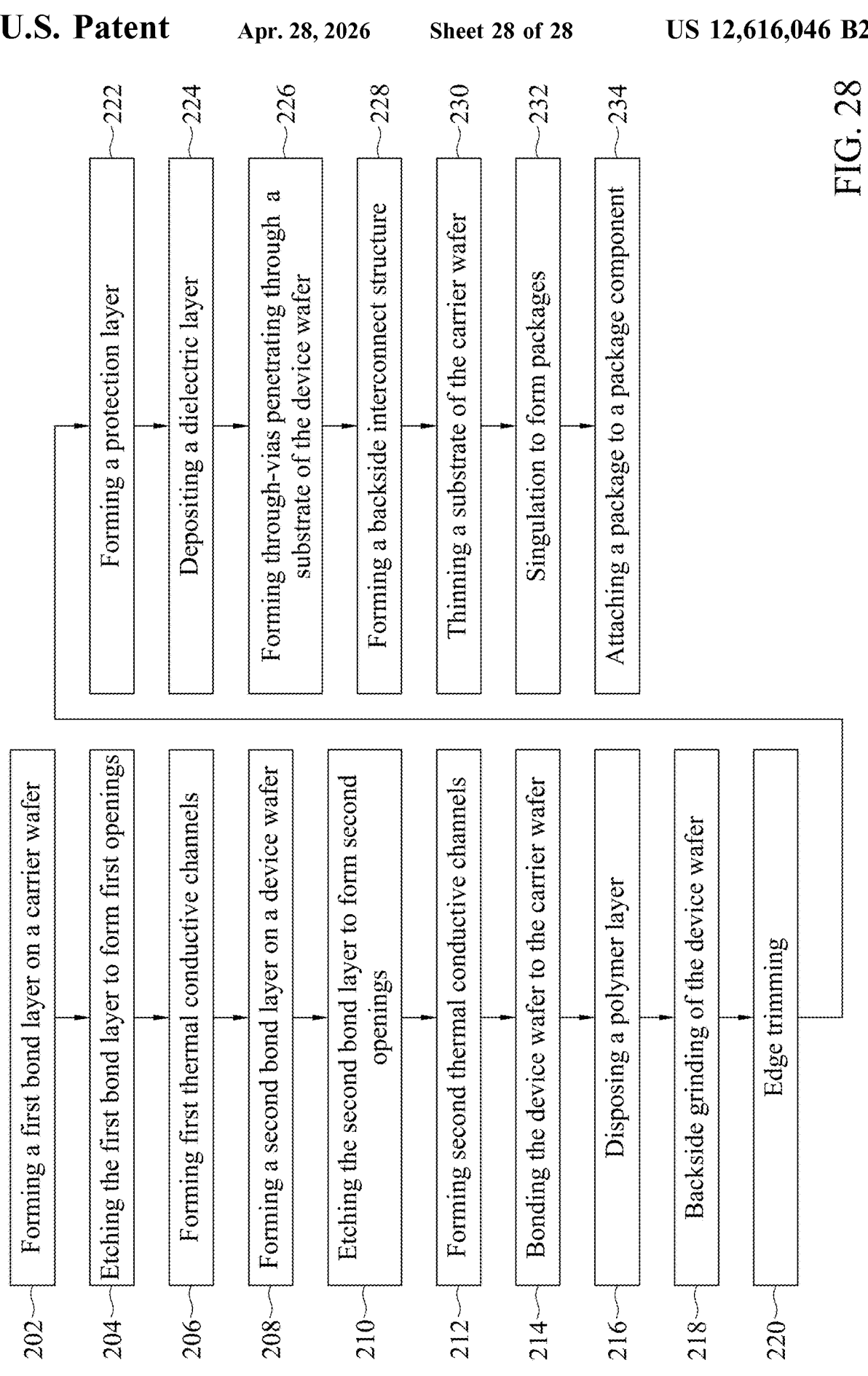
FIG. 28 illustrates a process flow of a wafer bonding process and the formation of a package in accordance with some embodiments.

Bond layer 14 is deposited on substrate 12. The respective process is illustrated as process 202 in the process flow 200 as shown in FIG. 28. In accordance with some embodiments, bond layer 14 is formed of or comprises a dielectric material, which may be a silicon-based dielectric material such as silicon oxide ($SiO_2$), SiN, SiON, SiOCN, SiC, SiCN, or the like, or combinations thereof. In accordance with some embodiments, bond layer 14 has a thickness in a range between about 10 nm and about 3,000 nm.

In accordance with some embodiments of the present disclosure, bond layer 14 is formed using High-Density Plasma Chemical Vapor Deposition (HDPCVD), Plasma Enhanced Chemical Vapor Deposition (PECVD), Chemical Vapor Deposition (CVD), Low-Pressure Chemical Vapor Deposition (LPCVD), Atomic Layer deposition (ALD), or the like.

In accordance with some embodiments, bond layer 14 is in physical contact with substrate 12. In accordance with alternative embodiments, carrier wafer 10 includes a plurality of layers (not shown) between bond layer 14 and substrate 12. For example, there may be an oxide-based layer formed of an oxide-based material (which may also be silicon oxide based) such as silicon oxide, phospho-silicate glass (PSG), borosilicate glass (BSG), boron-doped phospho silicate glass (BPSG), fluorine-doped silicate glass (FSG), or the like. There may also be a nitride-based layer formed of or comprising silicon nitride, while it may also be formed of or comprise other materials such as silicon oxynitride (SiON). In accordance with some embodiments of the present disclosure, the layers between substrate 12 and bond layer 14 may be formed using PECVD, CVD, LPCVD, ALD, or the like. There may also be alignment marks formed between bond layer 14 and substrate 12. The alignment marks may be formed as metal plugs, which may be formed through damascene processes.

Figure 2:
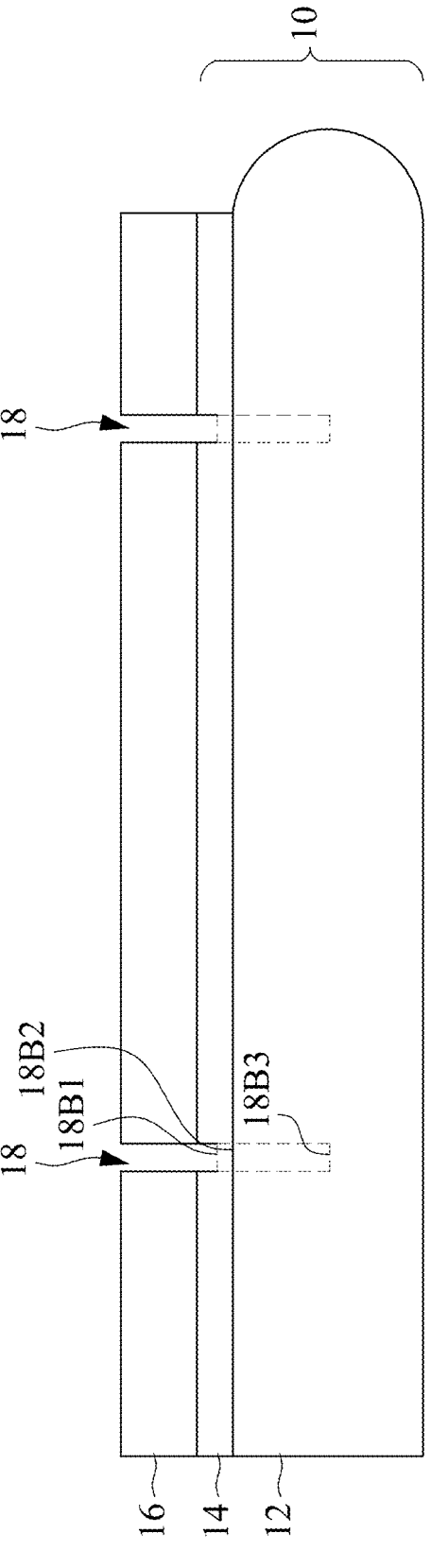

Referring to FIG. 2, etching mask 16 is formed and patterned. Etching mask 16 may include a photoresist, and may be a single-layer etching mask or a multi-layer etching mask, for example, including an under layer, a middle layer, and a top layer. Etching mask 16 is patterned to form openings 18. In accordance with some embodiments, there are a plurality of openings 18, which may be arranged as having a repeated pattern such as an array, a plurality of parallel strips, or may be arranged as having random patterns.

An etching process is then performed using etching mask 16 to extend openings 18 into bond layer 14. The respective process is illustrated as process 204 in the process flow 200 as shown in FIG. 28. In accordance with some embodiments, openings 18 have bottoms level with the bottom surface of bond layer 14, and the corresponding bottoms of openings 18 are at the level as shown as 18B2. In accordance with alternative embodiments, openings 18 extend partially into bond layer 14, with the bottoms 18B1 of openings 18 being at an intermediate level between the top surface and the bottom surface of bond layer 14. In accordance with yet alternative embodiments, openings 18 penetrate through bond layer 14 and any other layer between bond layer 14 and substrate 12, and extend into substrate 12. The bottoms of the corresponding openings 18 are shown as bottoms 18B3. Etching mask 16 is removed after the formation of openings 18.

Figure 3:
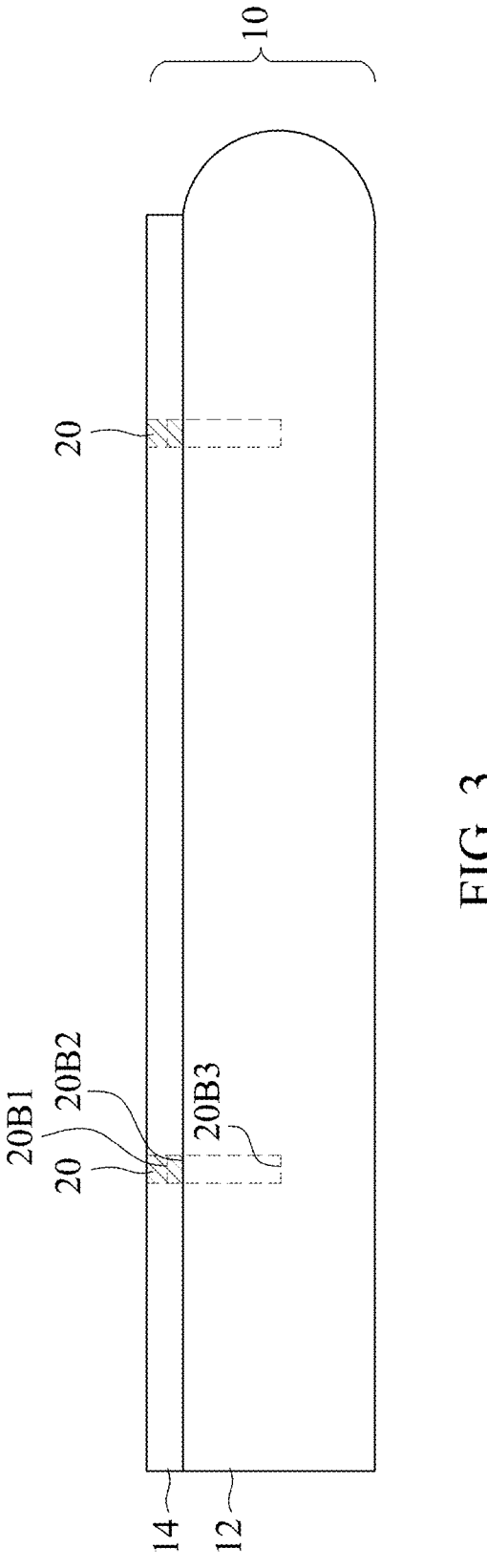

Referring to FIG. 3, thermal conductive channels 20 are formed. The respective process is illustrated as process 206 in the process flow 200 as shown in FIG. 28. Thermal conductive channels 20 have thermal conductivity higher than the thermal conductivity of bond layer 14. The thermal conductivity of thermal conductive channels 20 may also be greater than the thermal conductivity of substrate 12. In accordance with some embodiments, thermal conductive channels 20 are formed of or comprise copper, aluminum, nickel, titanium, tantalum, silicon, or the like, composite layers thereof, and/or alloys thereof. The formation of thermal conductive channels 20 may include depositing a thermal conductive material(s) into the openings 18 (FIG. 2), and then performing a planarization process such as a Chemical Mechanical Polish (CMP) process or a mechanical polish process. The bottoms 20B1, 20B2, and 20B3 illustrate the possible positions of the bottoms of the resulting thermal conductive channels 20. Thermal conductive channels 20 may be electrically floating.

Figure 4:
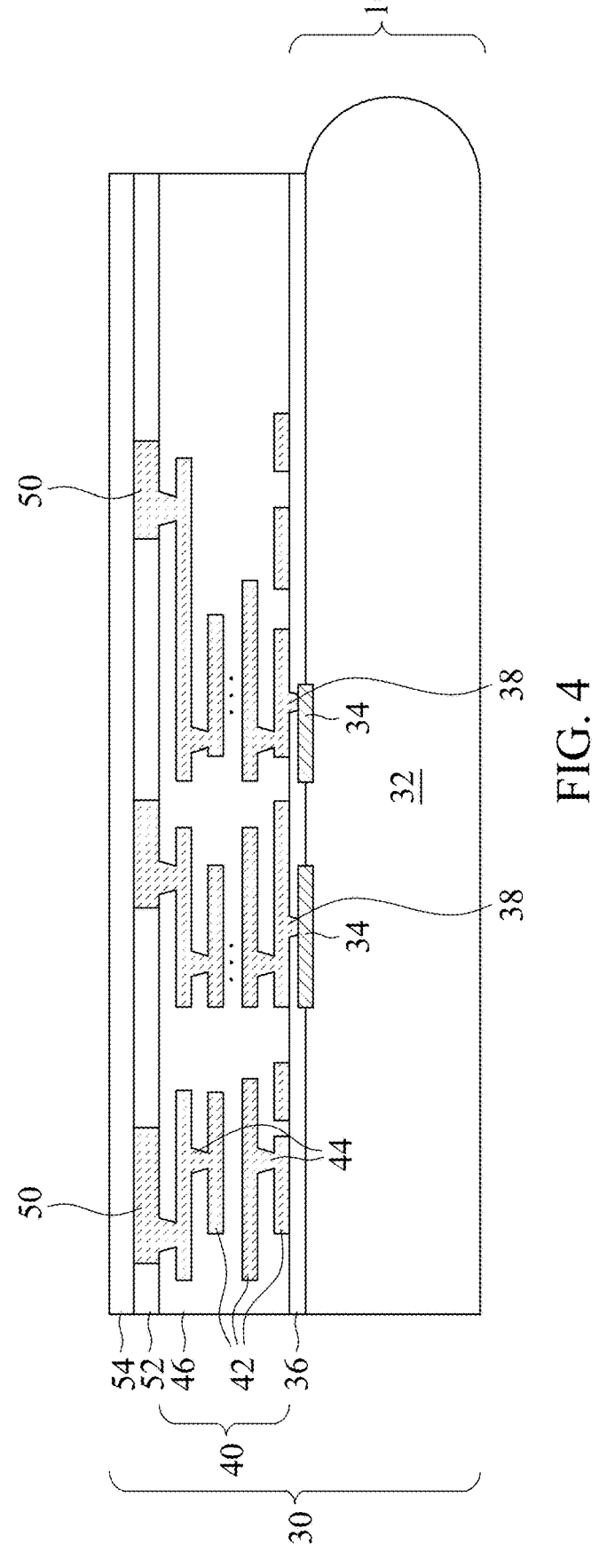
Figure 7:
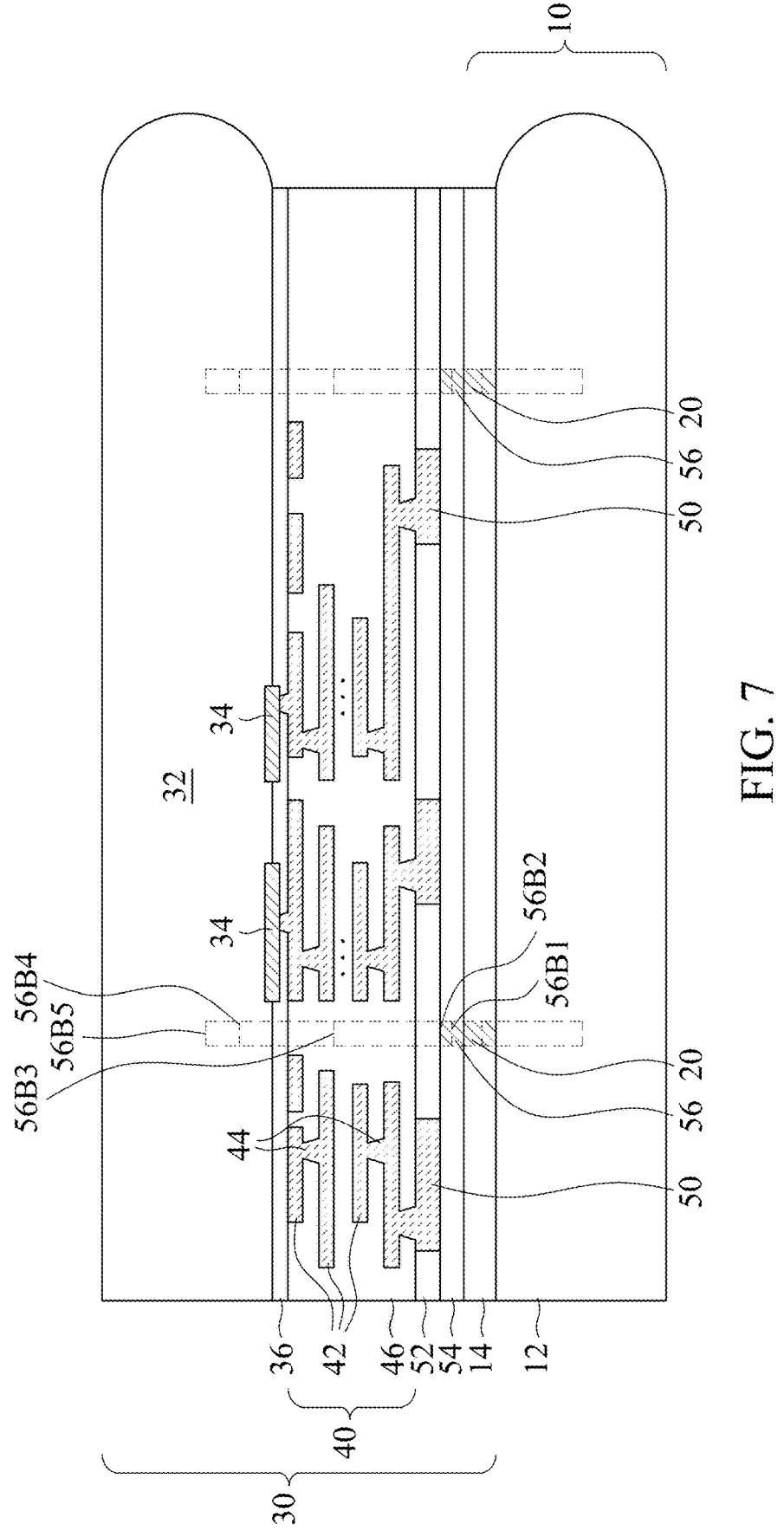
Figure 12:
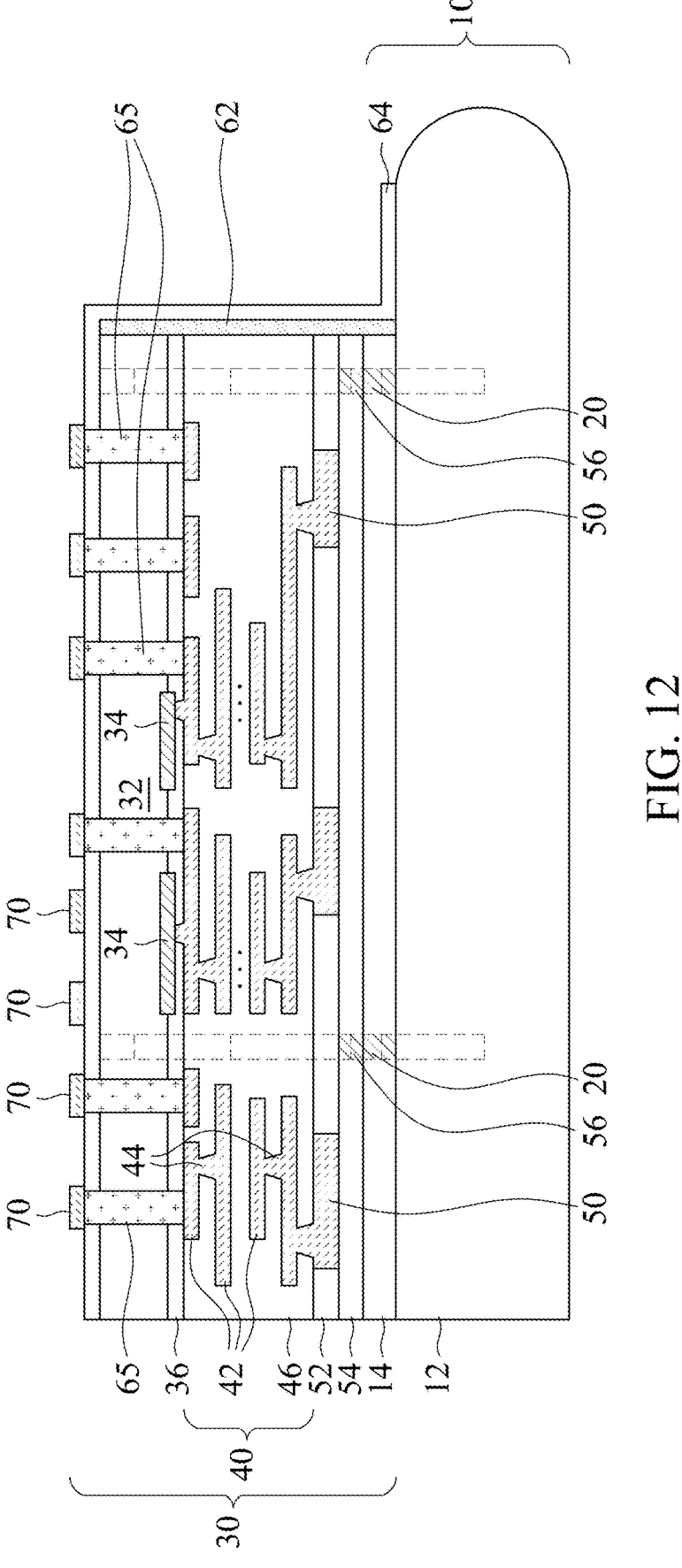

Referring to FIG. 4, device wafer 30 is formed, device wafer 30 may be an un-sawed wafer, and the bonding process as shown in FIG. 7 is a wafer-to-wafer bonding process. In accordance with some embodiments, device wafer 30 includes substrate 32, and integrated circuit devices 34 at a surface of substrate 32. In accordance with some embodiments, through-substrate vias (not shown) are formed extending from the front side (the illustrated top side) into substrate 32. In accordance with alternative embodiments, no through-vias are formed at this stage, and the through-vias are formed in the process as shown in FIG. 12. Substrate 32 may be a semiconductor substrate such as a silicon substrate. In accordance with other embodiments, substrate 32 may include other semiconductor materials such as silicon germanium, carbon-doped silicon, or the like. Substrate 32 may be a bulk substrate, or may have a layered structure, for example, including a silicon substrate and a silicon germanium layer over the silicon substrate.

In accordance with some embodiments, device wafer 30 includes device dies, which may include logic dies, memory dies, input-output dies, Integrated Passive Devices (IPDs), or the like, or combinations thereof. For example, the logic device dies in device wafer 30 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in device wafer 30 may include Static Random Access Memory (SRAM) dies, Dynamic Random Access Memory (DRAM) dies, or the like. Device wafer 30 may be a simple device wafer including a semiconductor substrate extending continuously throughout device wafer 30, or may be a reconstructed wafer including device dies packaged therein, System-on-Chip (SoC) dies including a plurality of integrated circuits (or device dies) integrated as a system, or the like.

In accordance with some embodiments of the present disclosure, integrated circuit devices 34 are formed on the top surface of semiconductor substrate 32. Example integrated circuit devices 34 may include Complementary Metal-Oxide Semiconductor (CMOS) transistors, resistors, capacitors, diodes, and/or the like. The details of integrated circuit devices 34 are not illustrated herein. In accordance with alternative embodiments, device wafer 30 is used for forming interposers, in which substrate 32 may be a semiconductor substrate or a dielectric substrate.

Inter-Layer Dielectric (ILD) 36 is formed over semiconductor substrate 32 and fills the space between the gate stacks of transistors (not shown) in integrated circuit devices 34. In accordance with some example embodiments, ILD 36 is formed of or comprises silicon oxide, Phospho Silicate Glass (PSG), Boro Silicate Glass (BSG), Boron-Doped Phospho Silicate Glass (BPSG), Fluorine-Doped Silicate Glass (FSG), or the like. ILD 36 may be formed using spin coating, Flowable Chemical Vapor Deposition (FCVD), Chemical Vapor Deposition (CVD), or the like. In accordance with some embodiments of the present disclosure, ILD 36 is formed using a deposition method such as PECVD, LPCVD, or the like.

Contact plugs 38 are formed in ILD 36, and are used to electrically connect integrated circuit devices 34 to overlying metal lines and vias. In accordance with some embodiments of the present disclosure, contact plugs 38 are formed of a conductive material selected from tungsten, aluminum, copper, titanium, tantalum, titanium nitride, tantalum nitride, alloys thereof, and/or multi-layers thereof. The formation of contact plugs 38 may include forming contact openings in ILD 36, filling a conductive material(s) into the contact openings, and performing a planarization process (such as a Chemical Mechanical Polish (CMP) process) to level the top surfaces of contact plugs 38 with the top surface of ILD 36.

Over ILD 36 and contact plugs 38 resides interconnect structure 40. Interconnect structure 40 includes metal lines 42 and vias 44, which are formed in dielectric layers 46. Dielectric layers 46 may include Inter-Metal Dielectric (IMD) layers 46 hereinafter. In accordance with some embodiments of the present disclosure, some of dielectric layers 46 are formed of low-k dielectric materials having dielectric constant values (k-values) lower than about 3.0. Dielectric layers 46 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layers 46 includes depositing a porogen-containing dielectric material, and then performing a curing process to drive out the porogen, and hence the remaining dielectric layers 46 are porous. In accordance with alternative embodiments of the present disclosure, some or all of dielectric layers 46 are formed of non-low-k dielectric materials such as silicon oxide, silicon carbide (SiC), silicon carbo-nitride (SiCN), silicon oxy-carbo-nitride (SiOCN), or the like. Etch stop layers (not shown), which may be formed of silicon carbide, silicon nitride, silicon oxynitride, aluminum oxide, aluminum nitride, or the like, or multi-layers thereof, are formed between dielectric layers 46, and are not shown for simplicity.

Metal lines 42 and vias 44 are formed in dielectric layers 46. The metal lines 42 at a same level are collectively referred to as a metal layer hereinafter. In accordance with some embodiments of the present disclosure, interconnect structure 40 includes a plurality of metal layers that are interconnected through vias 44. The number of IMD layers is determined based upon the routing requirement. For example, there may be between 5 and 15 IMD layers.

Metal lines 42 and vias 44 may be formed of copper or copper alloys, and they can also be formed of other metals. The formation process may include single damascene processes and dual damascene processes. In an example single damascene process, a trench is first formed in one of dielectric layers 46, followed by filling the trench with a conductive material(s). A planarization process such as a CMP process is then performed to remove the excess portions of the conductive material(s) higher than the top surface of the IMD layer, leaving a metal line in the trench. In a dual damascene process, both a trench and a via opening are formed in an IMD layer, with the via opening underlying and connected to the trench. The conductive material(s) is then filled into the trench and the via opening to form a metal line and a via, respectively. The conductive material(s) may include a diffusion barrier layer and a copper-containing metallic material over the diffusion barrier layer. The diffusion barrier layer may include titanium, titanium nitride, tantalum, tantalum nitride, or the like.

Dielectric layers 46 may further include passivation layers over the low-k dielectric layers. For example, there may be undoped silicate-glass (USG) layers, silicon oxide layers, silicon nitride layers, etc., over the damascene metal lines 42 and vias 44. The passivation layers are denser than the low-k dielectric layers, and have the function of isolating the low-k dielectric layers from detrimental chemicals and gases such as moisture.

In accordance with some embodiments, there may be top metal pads 50 formed over interconnect structure 40, and electrically connecting to integrated circuit devices 34 through metal lines 42 and vias 44. The top metal pads 50 may be formed of or comprise copper, nickel, titanium, palladium, or the like, or alloys thereof. In accordance with some embodiments, top metal pads 50 are in a passivation layer 52. In accordance with alternative embodiments, a polymer layer 52 (which may be polyimide, polybenzoxazole (PBO), or the like) may be formed, with the top metal pads 50 being in the polymer layer.

Bond layer 54 is deposited on the top of device wafer 30, and hence is a top surface layer of device wafer 30. The respective process is illustrated as process 208 in the process flow 200 as shown in FIG. 28. Bond layer 54 may be formed of a material selected from the same group of candidate materials for forming bond layer 14. For example, bond layer 54 may be selected from silicon oxide ($SiO_2$), SiN, SiON, SiOCN, SiOC, SiC, SiCN, or the like, or combinations thereof. The material of bond layers 14 and 54 may be the same as each other or different from each other. In accordance with some embodiments, bond layer 54 has a thickness in a range between about 10 nm and about 3,000 nm.

Figure 5:
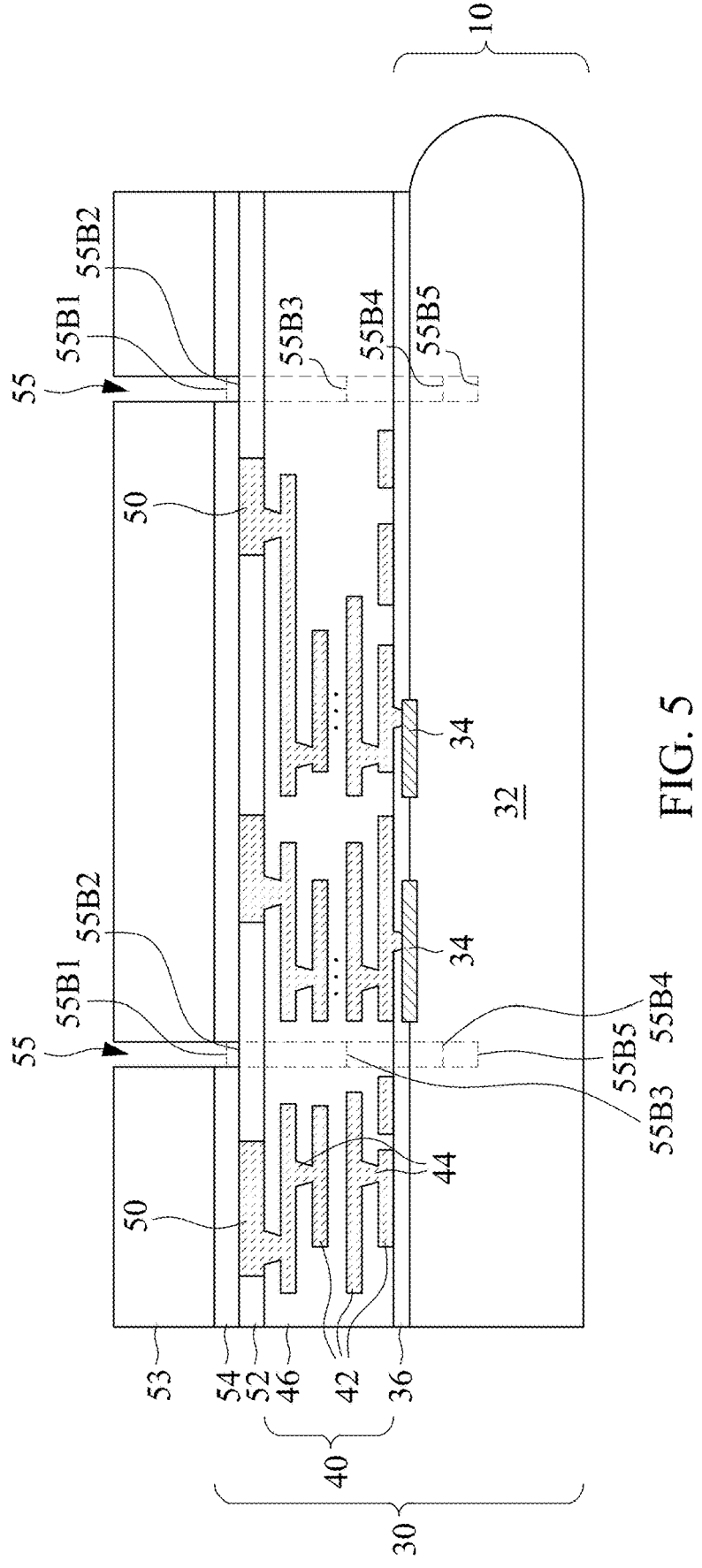

Referring to FIG. 5, etching mask 53 is formed. Etching mask 53 is patterned to form openings 55. In accordance with some embodiments, there are a plurality of openings 55, which may be arranged as having a repeated pattern such as an array, or may be arranged as having random patterns.

An etching process is then performed using etching mask 53 to extend openings 55 into bond layer 54. The respective process is illustrated as process 210 in the process flow 200 as shown in FIG. 28. In accordance with some embodiments, openings 55 have bottoms level with the bottom surface of bond layer 54, and the corresponding bottoms of openings 55 are at the level as shown as 55B2. In accordance with alternative embodiments, openings 55 extend partially into bond layer 54, with the bottoms 55B1 of openings 55 being at an intermediate level between the top surface and the bottom surface of bond layer 54. In accordance with yet alternative embodiments, openings 55 penetrate through bond layer 54 and any other layer between bond layer 54 and substrate 32, and extend any level in dielectric layers 46 or substrate 32. The corresponding openings 55 are shown as having bottoms 55B3, 55B4, or 55B5. Etching mask 53 is removed after the formation of openings 55.

Figure 6:
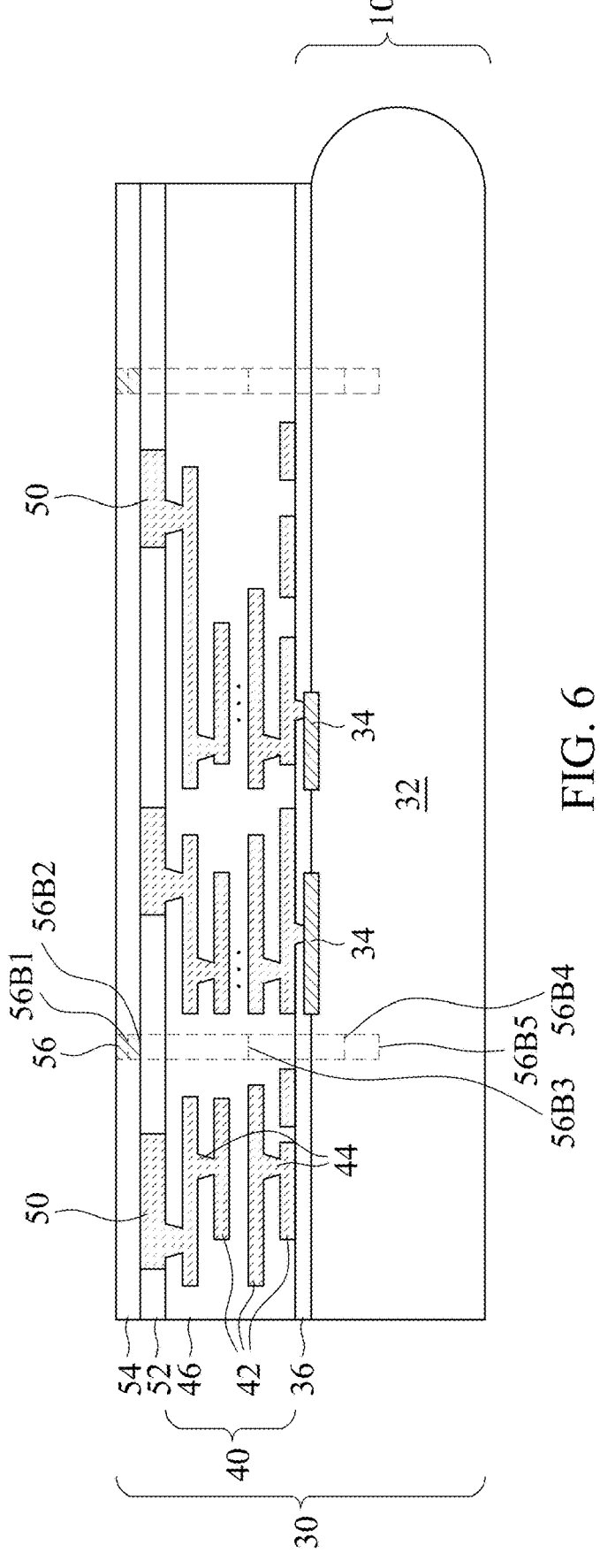

Referring to FIG. 6, thermal conductive channels 56 are formed. The respective process is illustrated as process 212 in the process flow 200 as shown in FIG. 28. Thermal conductive channels 56 have thermal conductivity higher than the thermal conductivity of bond layer 54 and dielectric layers 36, 46, and 52. The thermal conductivity of thermal conductive channels 56 may also be greater than the thermal conductivity of substrate 32. In accordance with some embodiments, thermal conductive channels 56 are formed of or comprise copper, aluminum, nickel, titanium, tantalum, or the like, composite layers thereof, and/or alloys thereof. The formation of thermal conductive channels 56 may include depositing a thermal conductive material(s) into the openings 55 (FIG. 5), and then performing a planarization process such as a CMP process or a mechanical polish process. The bottoms 56B1 through 56B5 illustrate the possible bottoms of the resulting thermal conductive channels 56. Thermal conductive channels 56 may also be electrically floating.

Referring to FIG. 7, device wafer 30 is flipped upside down, and bonded to carrier wafer 10. The respective process is illustrated as process 214 in the process flow 200 as shown in FIG. 28. Bond layer 54 is bonded to bond layer 14, with Si—O—Si bonds being formed to join bond layer 54 to bond layer 14. In accordance with some embodiments, thermal conductive channels 20 are bonded to thermal conductive channels 56 through direct metal-to-metal bonding, which is achieved through the inter-diffusion of the metal in thermal conductive channels 20 and the metal in thermal conductive channels 56. Accordingly, the bonding process may include a hybrid bonding process. In accordance with alternative embodiments, thermal conductive channels 20 are in physical contact with, and are not bonded to, the corresponding thermal conductive channels 56.

Figure 25:
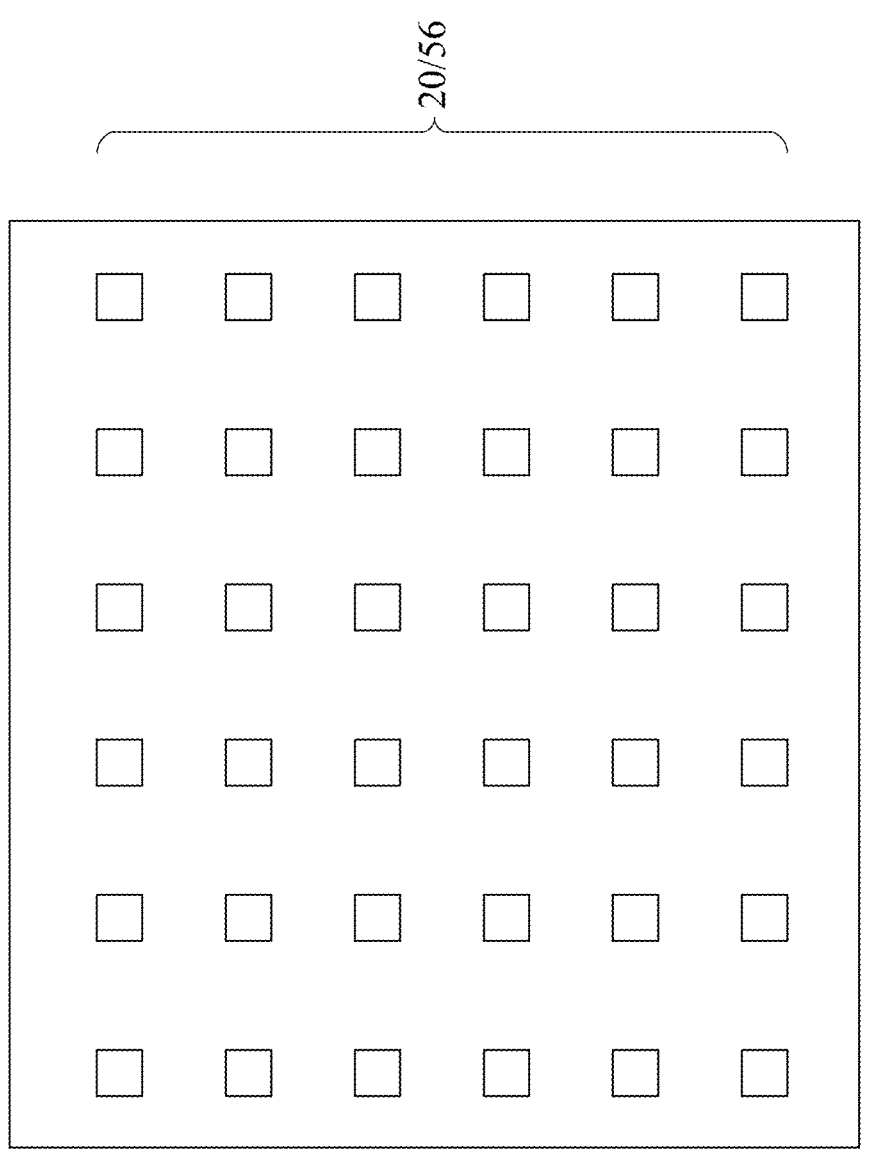
FIGS. 25-27 illustrate the top views of example thermal conductive channels in accordance with some embodiments.
Figure 26:
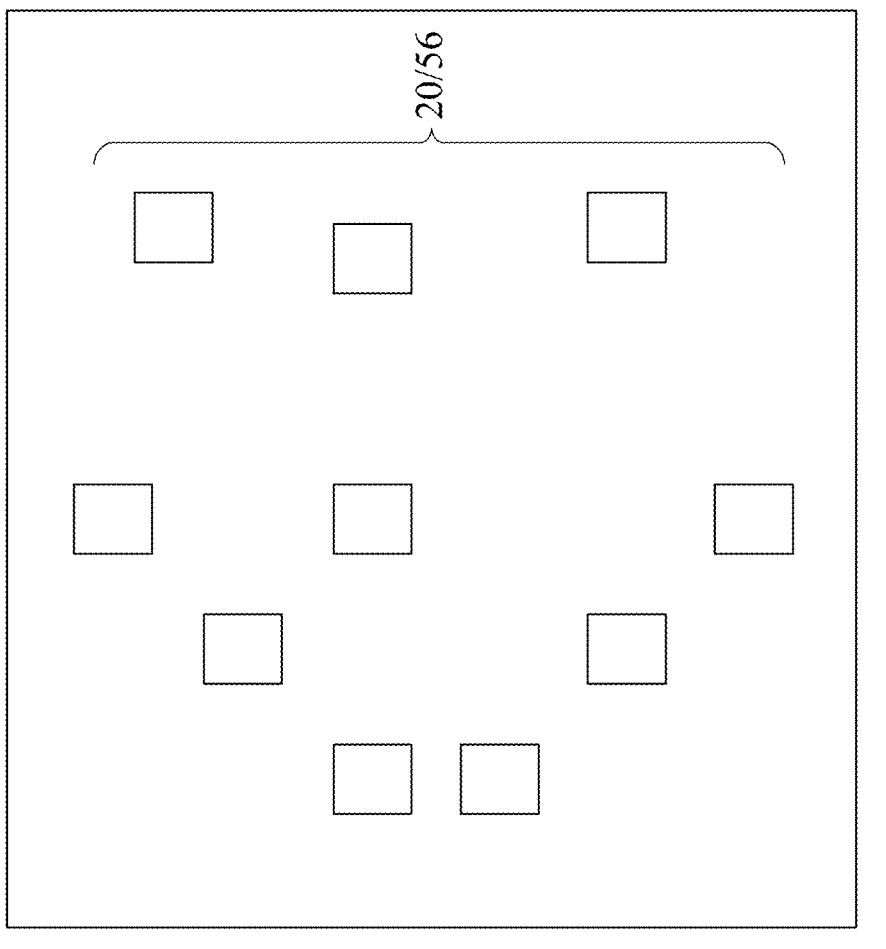
Figure 27:
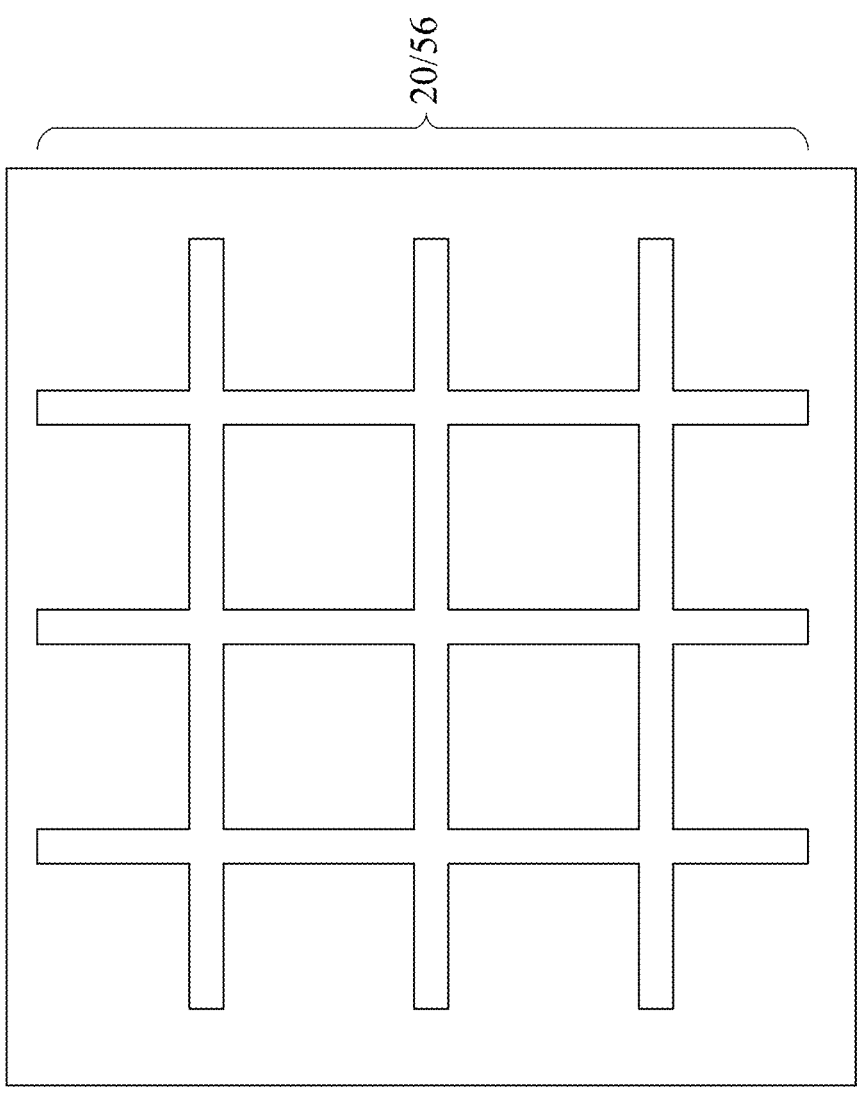

FIGS. 25 through 27 illustrate some example top views of thermal conductive channels 20 and 56 in accordance with some embodiments. In the top view, thermal conductive channels 20 may fully overlap thermal conductive channels 56, while they can still be distinguished from each other. Accordingly, each of thermal conductive channels 20 may be at least in physical contact with (and may be or may not be bonded to) one of thermal conductive channels 56, and vice versa. The patterns and the sizes of thermal conductive channels 20 and 56 may be designed as arrays as shown in FIG. 25. In accordance with alternative embodiments, thermal conductive channels 20 and 56 may be formed as a grid including horizontal strips joined with vertical strips, as shown in FIG. 27. In accordance with yet alternative embodiments, thermal conductive channels 20 and 56 may be formed as parallel strips, for example, with horizontal strips but not vertical strips. In the embodiments in which thermal conductive channels 56 extend into dielectric layers 52, 46 or substrate 32 (FIG. 5), the location and the sizes of thermal conductive channels 56 depend on the available spaces not occupied by metal lines 42 and integrated circuit devices, and hence the locations of thermal conductive channels 20 and 56 may have a random pattern, as shown in FIG. 26.

In accordance with yet alternative embodiments, some of the thermal conductive channels 56 may extend to different levels than other thermal conductive channels 56. For example, some of thermal conductive channels 56 may extend to 56B1 (FIG. 5) or 56B2, while some other thermal conductive channels 56 may extend to levels 56B3, 56B4, and/or 56B4 in any combination, depending on the availability in spaces. These embodiments may be achieved by more than one lithography process and more than one etching process to achieve different etching depths.

Figure 8:
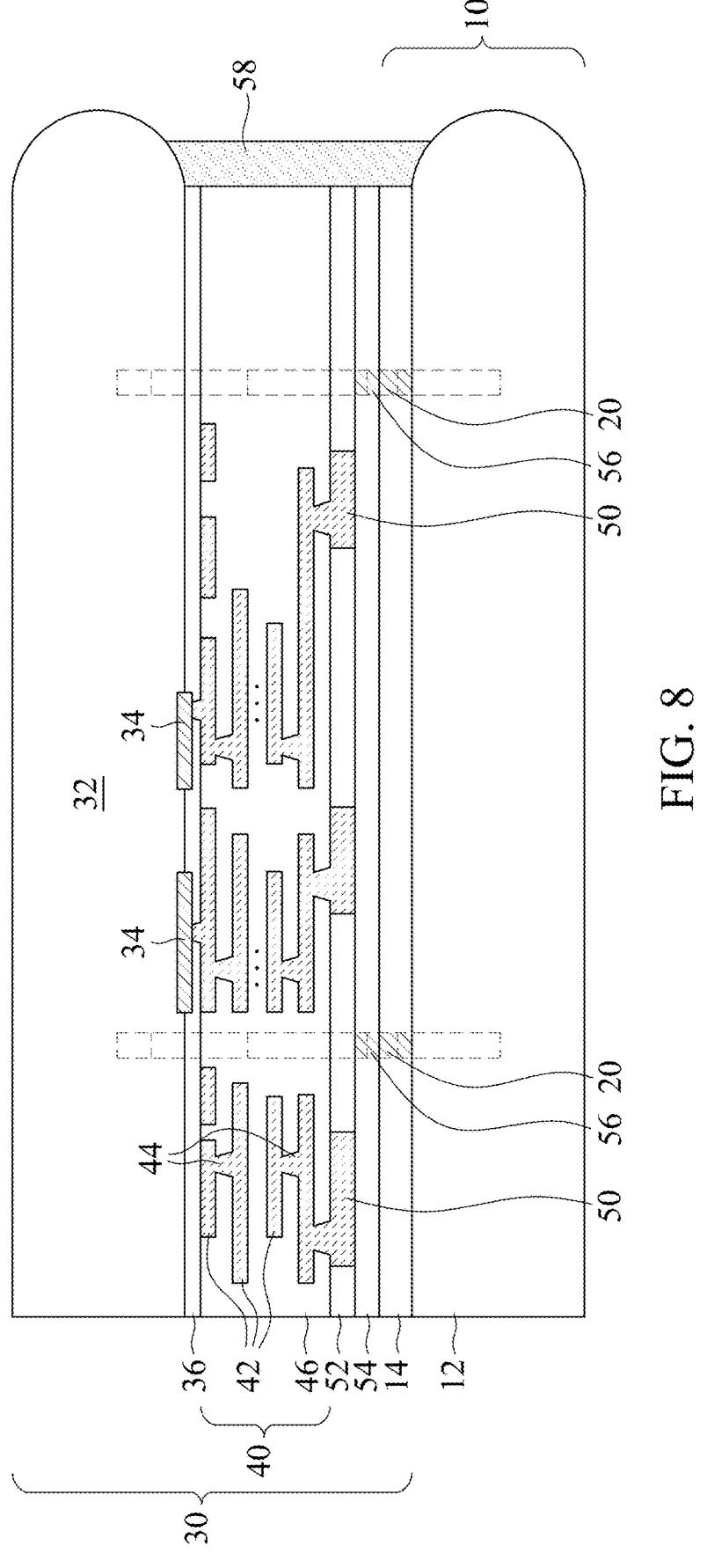

Referring to FIG. 8, a polymer layer 58 is dispensed into the gap between substrate 12 and substrate 32, and on the sidewalls of interconnect structure 40. The respective process is illustrated as process 216 in the process flow 200 as shown in FIG. 28. In accordance with some embodiments, polymer layer 58 is formed of or comprises polyimide, PBO, or the like. Polymer layer 58 is dispensed in a flowable form, and is then cured and solidified. Furthermore, polymer layer 58 is dispensed as a ring fully encircling the region between substrate 12 and substrate 32.

Figure 9:
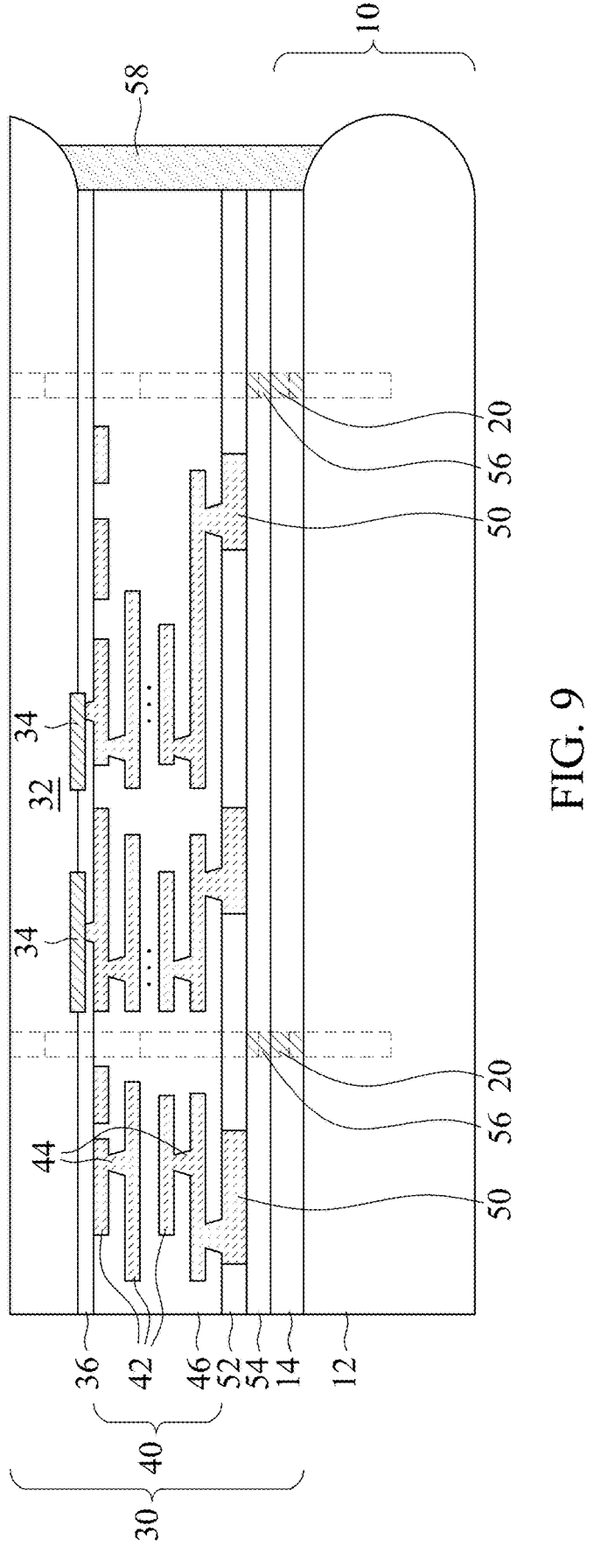

Referring to FIG. 9, a backside grinding process is performed from the backside of device wafer 30, and substrate 32 is thinned. The respective process is illustrated as process 218 in the process flow 200 as shown in FIG. 28. The backside grinding process may be performed through a CMP process or a mechanical polishing process. In the backside grinding process, polymer layer 58 has the function of preventing device wafer 30 from peeling off from carrier wafer 10. In addition, the grinding process and subsequent cleaning processes may involve the use of water, and polymer layer 58 can block moisture from penetrating into interconnect structure 40 from the sidewalls of dielectric layers 46, and may prevent the degradation of the dielectric layers and the metal features in device wafer 30.

Figure 10:
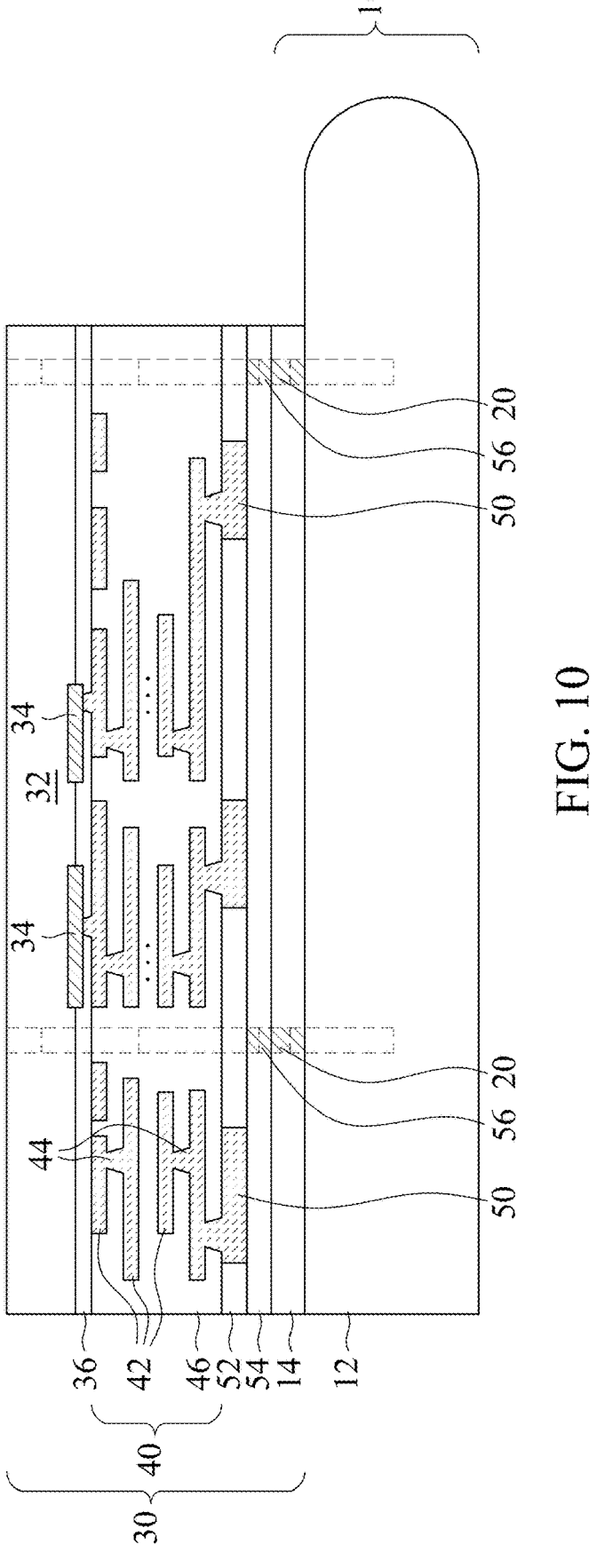

An edge trimming process is then performed to remove polymer layer 58, the edge portions of device wafer 30. Some edge portions of carrier wafer 10 may also be removed. The respective process is illustrated as process 220 in the process flow 200 as shown in FIG. 28. The resulting structure is shown in FIG. 10, wherein a sidewall of wafer 30 may be recessed laterally from the respective edge of carrier wafer 10. In the trimming process, a top portion of the substrate 12 may be trimmed to form a recess (not shown), which extends into substrate 12.

In a subsequent process, substrate 32 may further be thinned. In accordance with alternative embodiments, the further thinning of substrate 32 is skipped. In accordance with some embodiments, substrate 32 is thinned in a dry etching process, which may be an anisotropic etching process or an isotropic etching process. In accordance with alternative embodiments, the etching may be performed through a dry etching process followed by a wet etching process. For example, the dry etching process may be performed using an etching gas including fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, or the mixture of HBr, $Cl_2$, $O_2$, and $CH_2F_2$ etc. The wet etching process, if any, may be performed using KOH, tetramethylammonium hydroxide (TMAH), $CH_3COOH$, $NH_4OH$, $H_2O_2$, Isopropanol (IPA), the solution of HF, $HNO_3$, and $H_2O$, or the like.

In accordance with alternative embodiments, the thinning of substrate 32 may be performed through a CMP process or a mechanical grinding process. In the embodiments in which through-vias 65 (FIG. 12) have been formed previously to extend into semiconductor substrate 32, the through-vias 65 will be exposed by the thinning process.

Figure 11:
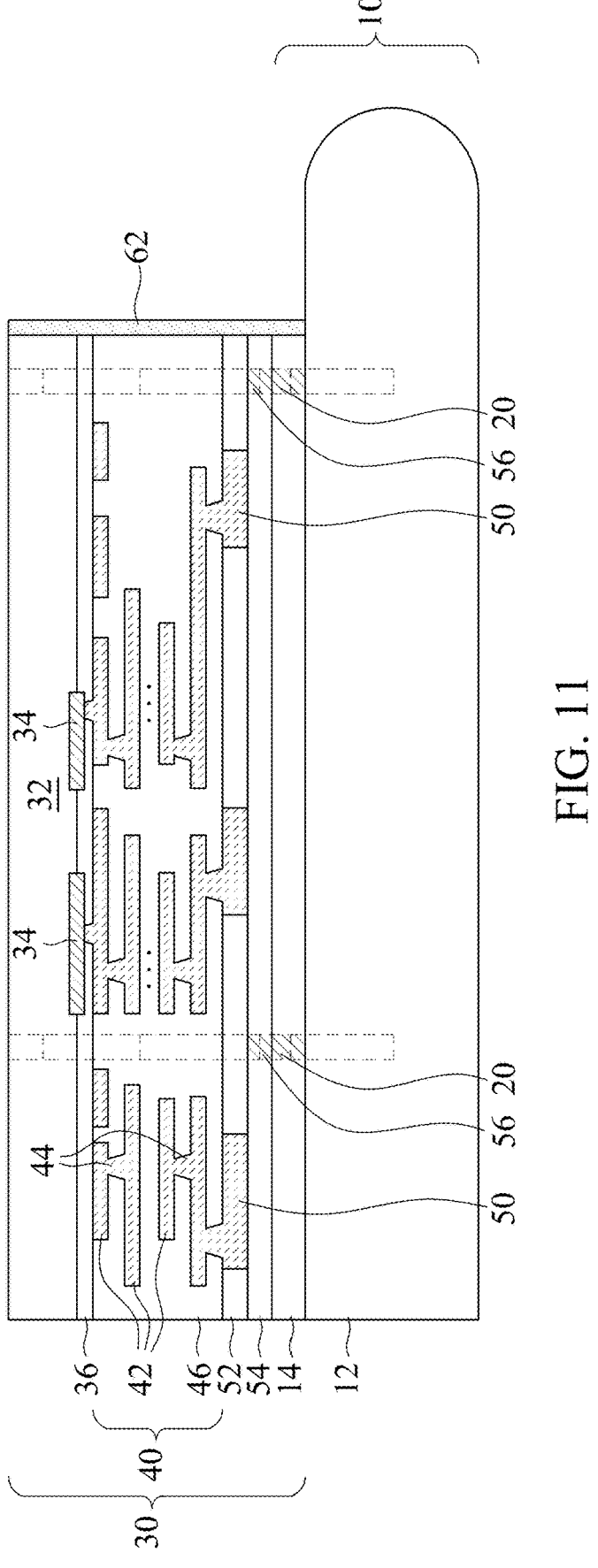

FIG. 11 illustrates the formation of protection layer 62, which is also an isolation layer. The respective process is illustrated as process 222 in the process flow 200 as shown in FIG. 28. In accordance with some embodiments, protection layer 62 comprises $SiO_2$, SiOC, SiOCN, SiN, SiC, SiCN, or the like. The formation of protection layer 62 may include a conformal deposition process such as CVD, ALD, or the like. The horizontal portion of protection layer 62 over wafer 30 is then removed, so that the top surface of device wafer 30 is exposed. In accordance with some embodiments, a CMP process is performed to remove a first portion of protection layer 62 overlapping device wafer 30. An etching process may be performed to remove a second portion of protection layer 62 overlapping and contacting substrate 12 in carrier wafer 10. In accordance with alternative embodiments, the second portion of protection layer 62 is not removed, and is left on the otherwise device wafer 10.

The remaining protection layer 62 forms a full ring encircling, and contacting, device wafer 30. Protection layer 62 has the function of preventing the peeling of the layers in device wafer 30. Also, protection layer 62 prevents moisture and oxygen from penetrating into device wafer 30 from sidewalls.

Referring to FIG. 12, dielectric layer 64 is formed, for example, through a conformal deposition process, which may be an ALD process, a CVD process, or the like. The respective process is illustrated as process 224 in the process flow 200 as shown in FIG. 28. In accordance with some embodiments, dielectric layer 64 is formed of or comprises silicon oxide, silicon nitride, silicon oxynitride, or the like. Through-vias 65 may be formed to penetrate through substrate 32, and electrically connecting to integrated circuit devices 34. The formation process may include etching dielectric layer 64 and substrate 32 to form through-openings. The etching may be stopped on the metal pads in interconnect structure 40. Next, an isolation layer is formed to encircle each of the through-openings.

The formation process of through-vias 65 may include depositing a conformal dielectric layer extending into the through-openings, and then performing an anisotropic etching process to re-expose the metal pads. A conductive material(s) is then deposited to fill the through-openings, followed by a planarization process to remove excess conductive materials outside of the through-openings. The remaining portions of the conductive material(s) are through-vias 65. The respective process is illustrated as process 226 in the process flow 200 as shown in FIG. 28.

In accordance with alternatively embodiments, the through-vias 65 have been formed previously (for example, in the process shown in FIG. 4). Accordingly, in the process shown in FIG. 12, a backside grinding process and an etch-back process may be performed on substrate 32, so that the top portions of through-vias 65 protrude higher than the recessed top surface of substrate 32. Dielectric layer 64 is then deposited, followed by a light CMP process to re-expose through-vias 65.

As shown in FIG. 12, dielectric layer 64 may extend on the outer sidewalls of protection layer 62. Dielectric layer 64 may further extend on and contacting the top surface of substrate 12. Conversely, dielectric layer 64 extends on, and contacting the top surface of, the horizontal portions of protection layer 62 in dashed region 63 (FIG. 7) when these portions of protection layer 62 are not removed.

Figure 13:
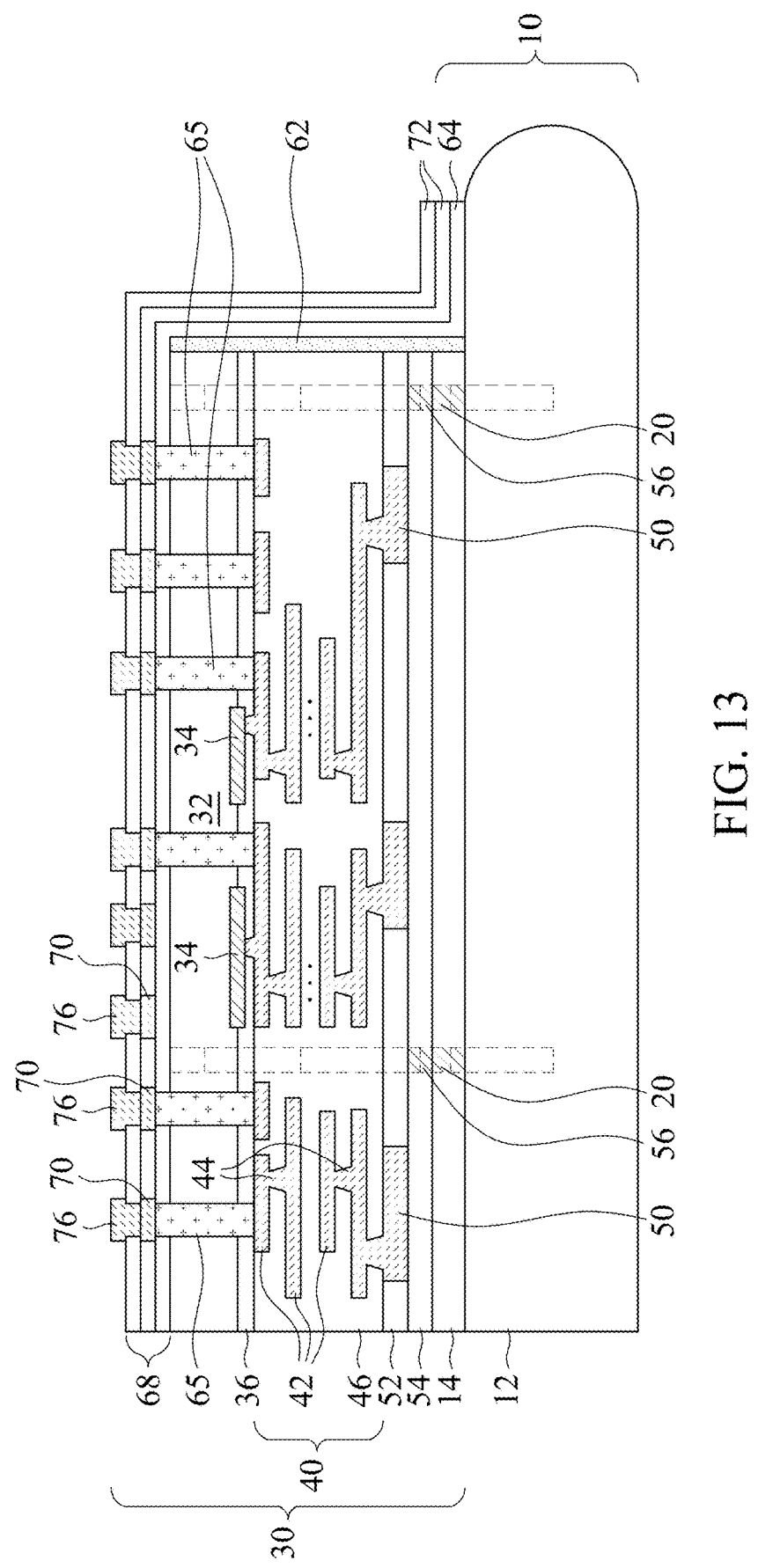

Referring to FIG. 13, backside interconnect structure 68 is formed, which includes one or a plurality of dielectric layers 72 and one or a plurality of layers of redistribution lines (RDLs) 70. The respective process is illustrated as process 228 in the process flow 200 as shown in FIG. 28. In accordance with some embodiments, RDLs 70 are formed through damascene processes, which include depositing the corresponding dielectric layers 72, forming trenches and via openings in the dielectric layers 72, and filling the trenches and via openings with a metallic material(s) to form RDLs 70. Dielectric layers 72 may be formed of or comprise inorganic dielectric materials such as silicon oxide, silicon nitride, silicon oxynitride, or the like.

In accordance with alternative embodiments, dielectric layers 72 may be formed of polymers, which may be photo-sensitive, and the formation process of an RDL layer may include depositing a metal seed layer, forming and patterning a plating mask over the metal seed layer, performing a plating process to form the RDLs, removing the plating mask to expose the underlying portions of the metal seed layer, and etching the exposed portions of the metal seed layer.

In accordance with some embodiments, electrical connectors 76 are formed on the back surface of device wafer 30.

Electrical connectors 76 may include metal bumps, metal pads, solder regions, or the like. In accordance with some embodiments, electrical connectors 76 protrude higher than the top surface of surface dielectric layer 72. In accordance with alternative embodiments, the top surface of electrical connectors 76 are coplanar with the surface dielectric layer 72.

Figure 14:
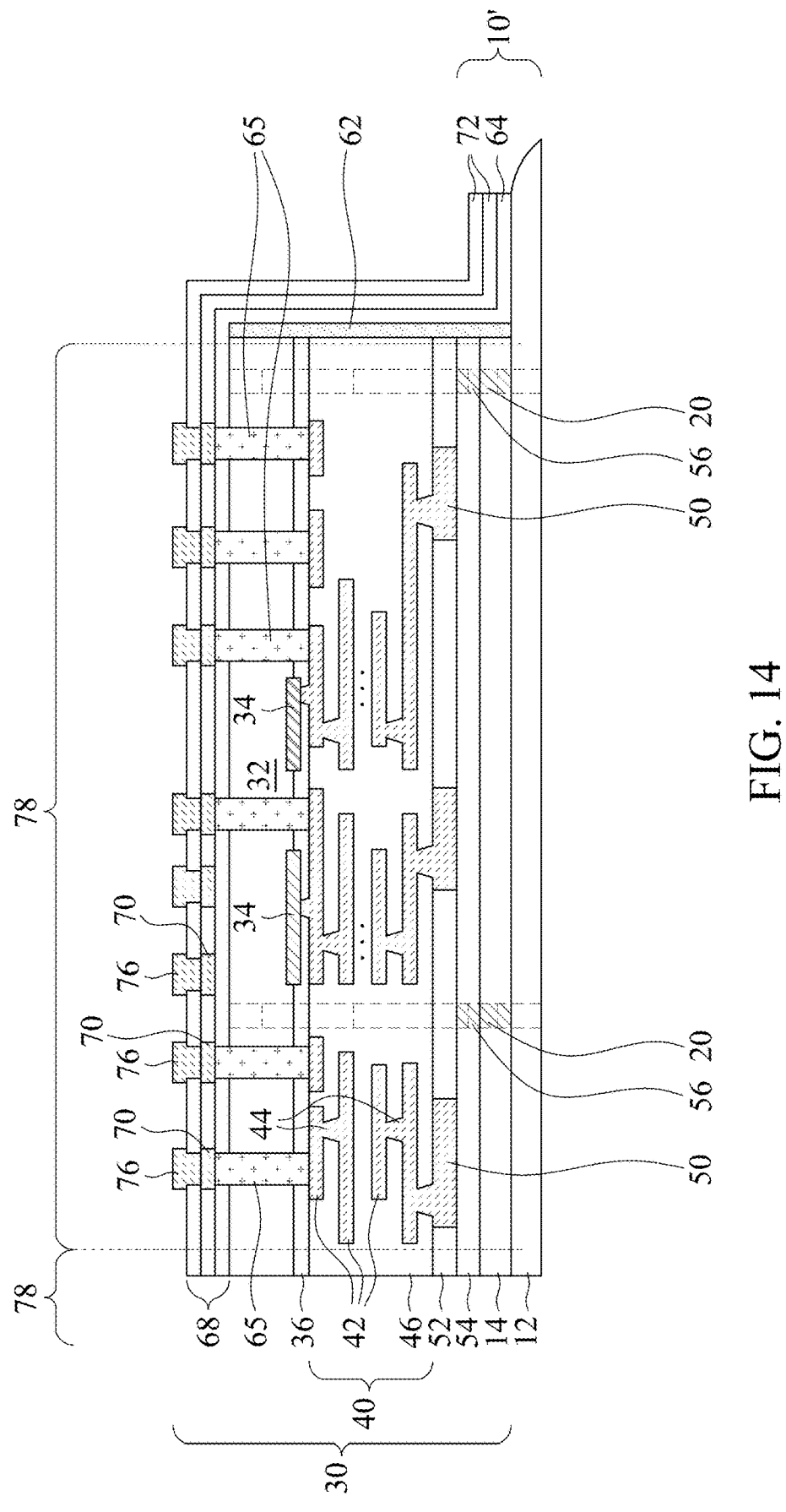

Referring to FIG. 14, substrate 12 is thinned, for example, through a CMP process or a mechanical grinding process. The respective process is illustrated as process 230 in the process flow 200 as shown in FIG. 28. In accordance with some embodiments in which thermal conductive channels 20 extend into substrate 12, after the thinning process, thermal conductive channels 20 are exposed. In accordance with alternative embodiments, thermal conductive channels 20 extend into substrate 12, and are not exposed after the thinning. In accordance with yet alternative embodiments, thermal conductive channels 20 do not extend into substrate 12.

In accordance with alternative embodiments, substrate 12 is fully removed, while bond layer 14 and thermal conductive channels 20 remain un-removed. In accordance with yet alternative embodiments, both of substrate 12 and bond layer 14 are removed. Thermal conductive channels 20 are also removed. Bond layer 54 and thermal conductive channels 56, however, remain un-removed.

Figure 15:
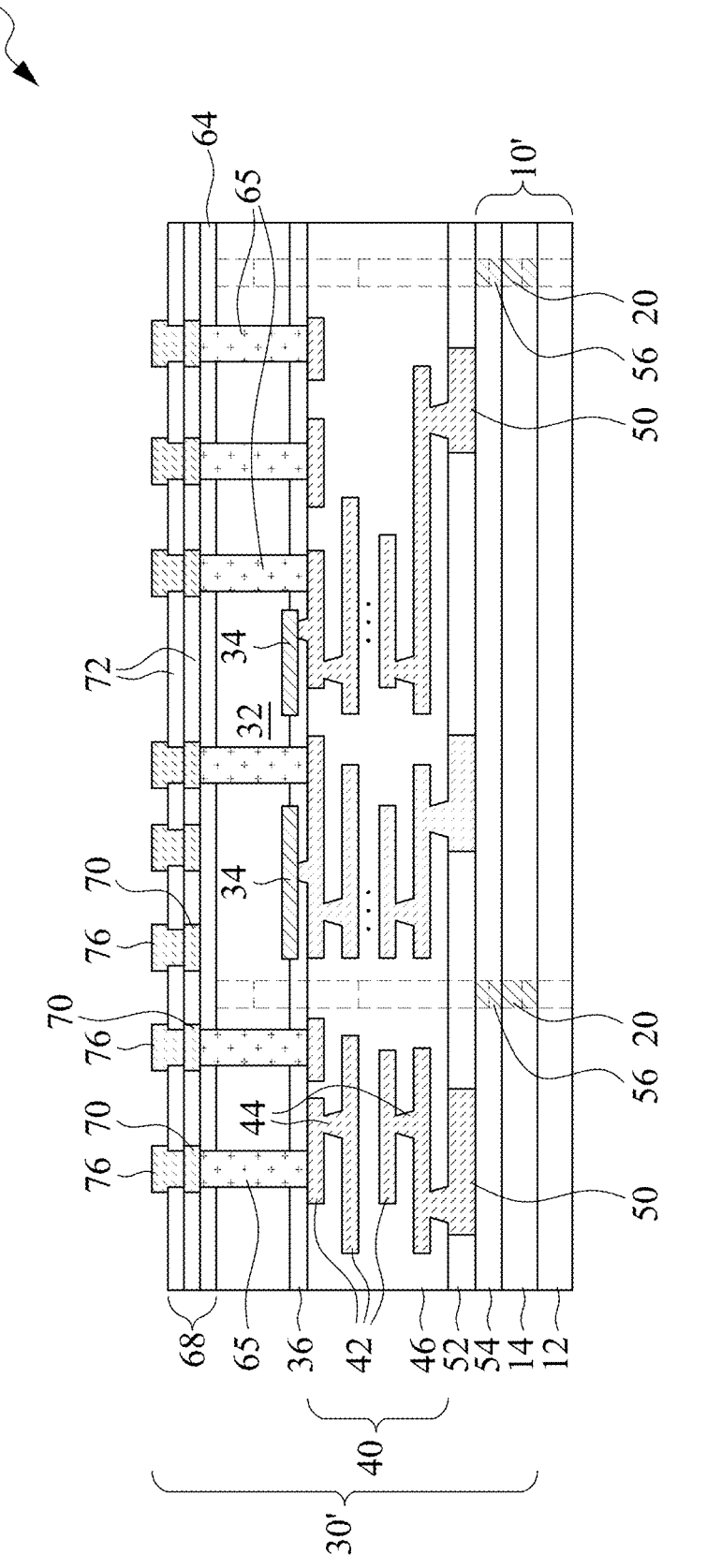

In accordance with some embodiments, device wafer 30 and substrate 12 may be singulated in a die-saw process to form discrete packages 78, each comprising one of device dies 30' and a portion of substrate 12. The respective process is illustrated as process 232 in the process flow 200 as shown in FIG. 28. FIG. 15 illustrates one of packages 78. Protection layer 62 is removed by the die-saw process, and does not exist in the resulting packages 78. In accordance with alternative embodiments, another device wafer is bonded to wafer 30 to form a reconstructed wafer, which reconstructed wafer is then singulated to separate device dies 30' from each other, with each of the device dies 30' being bonded with a device die from the other device wafer.

Figure 16:
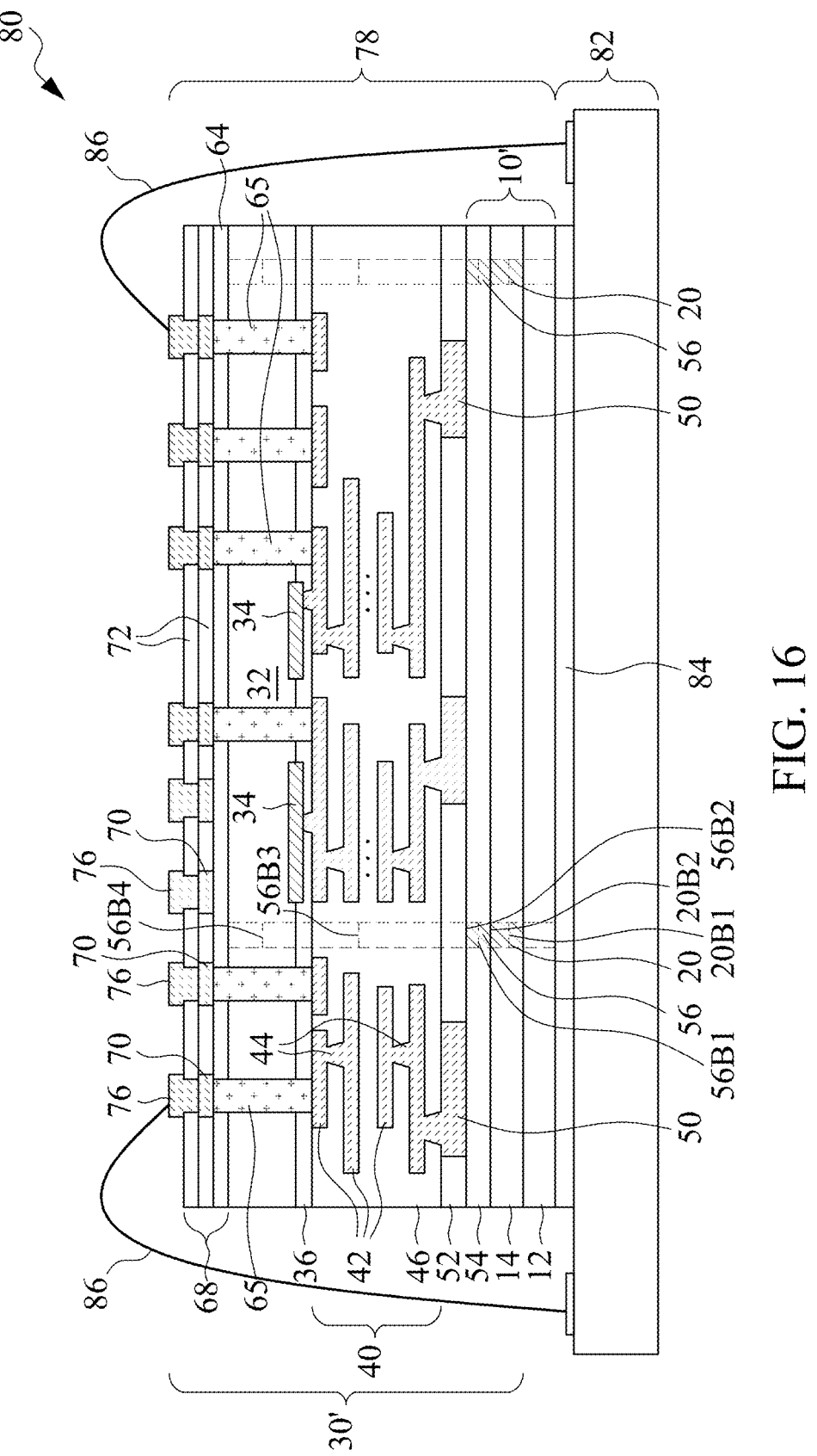
Figure 17:
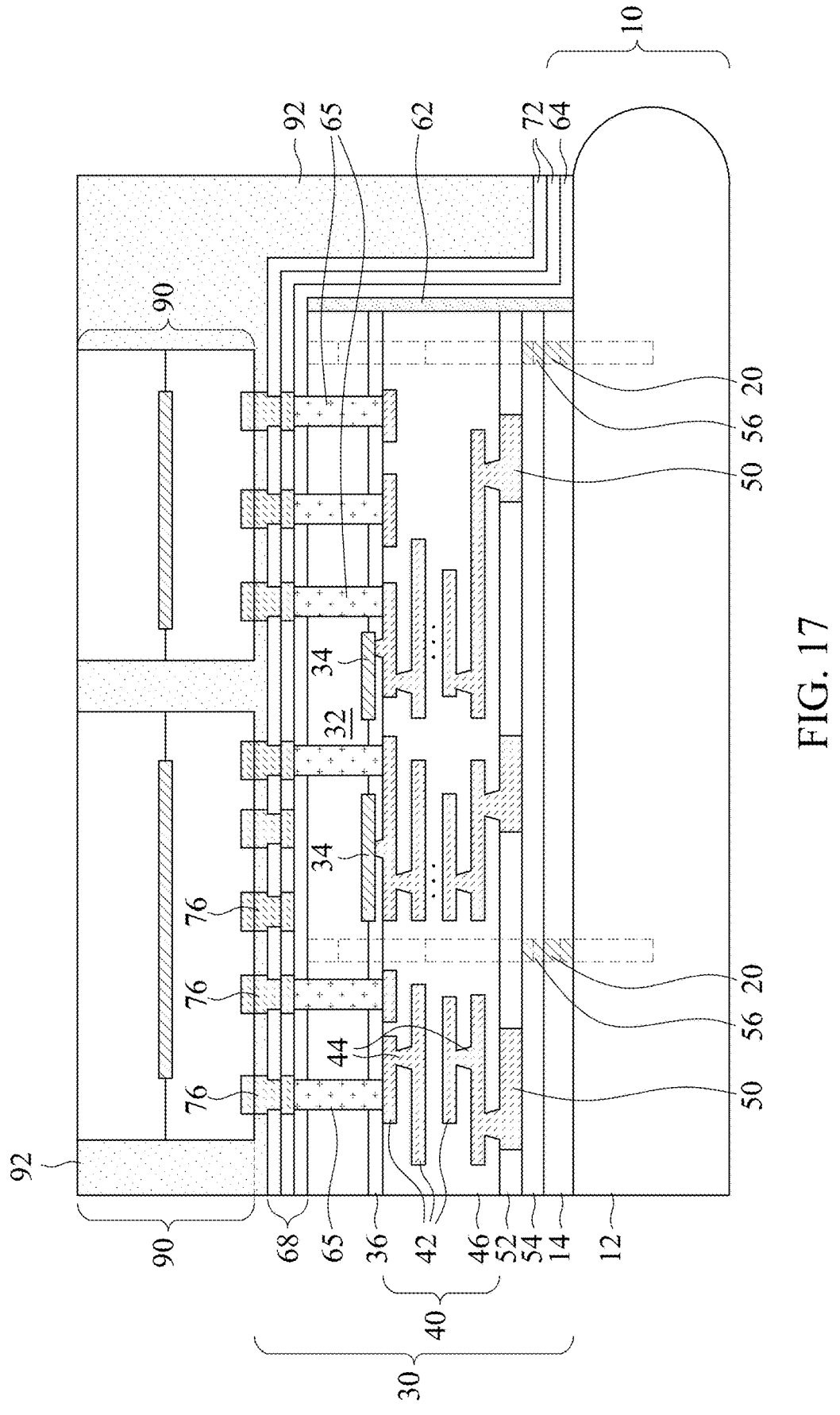
FIGS. 17-20 illustrate the intermediate stages in a wafer bonding process and the formation of thermal conductive channels in accordance with some embodiments.
Figure 18:
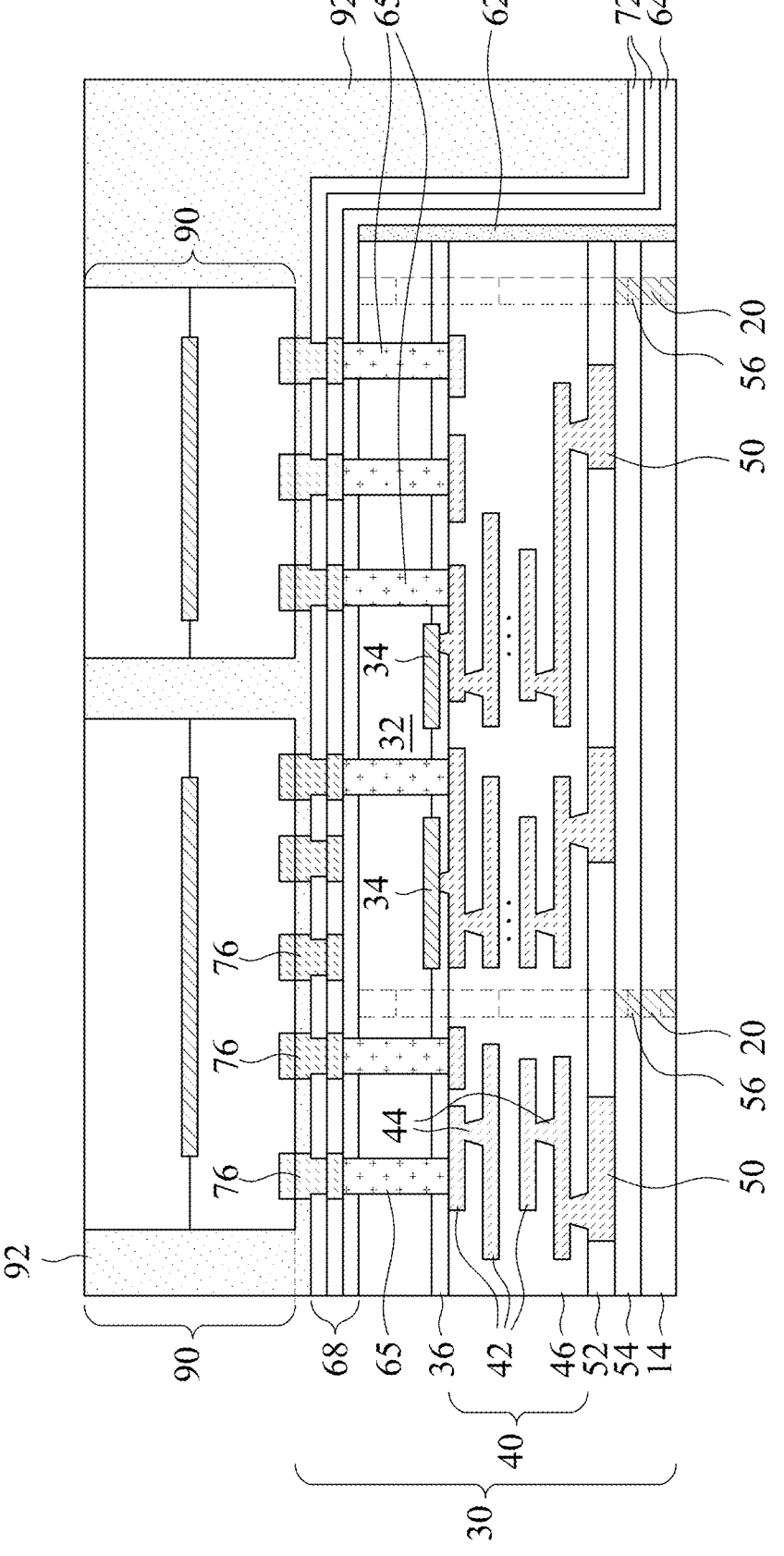
Figure 19:
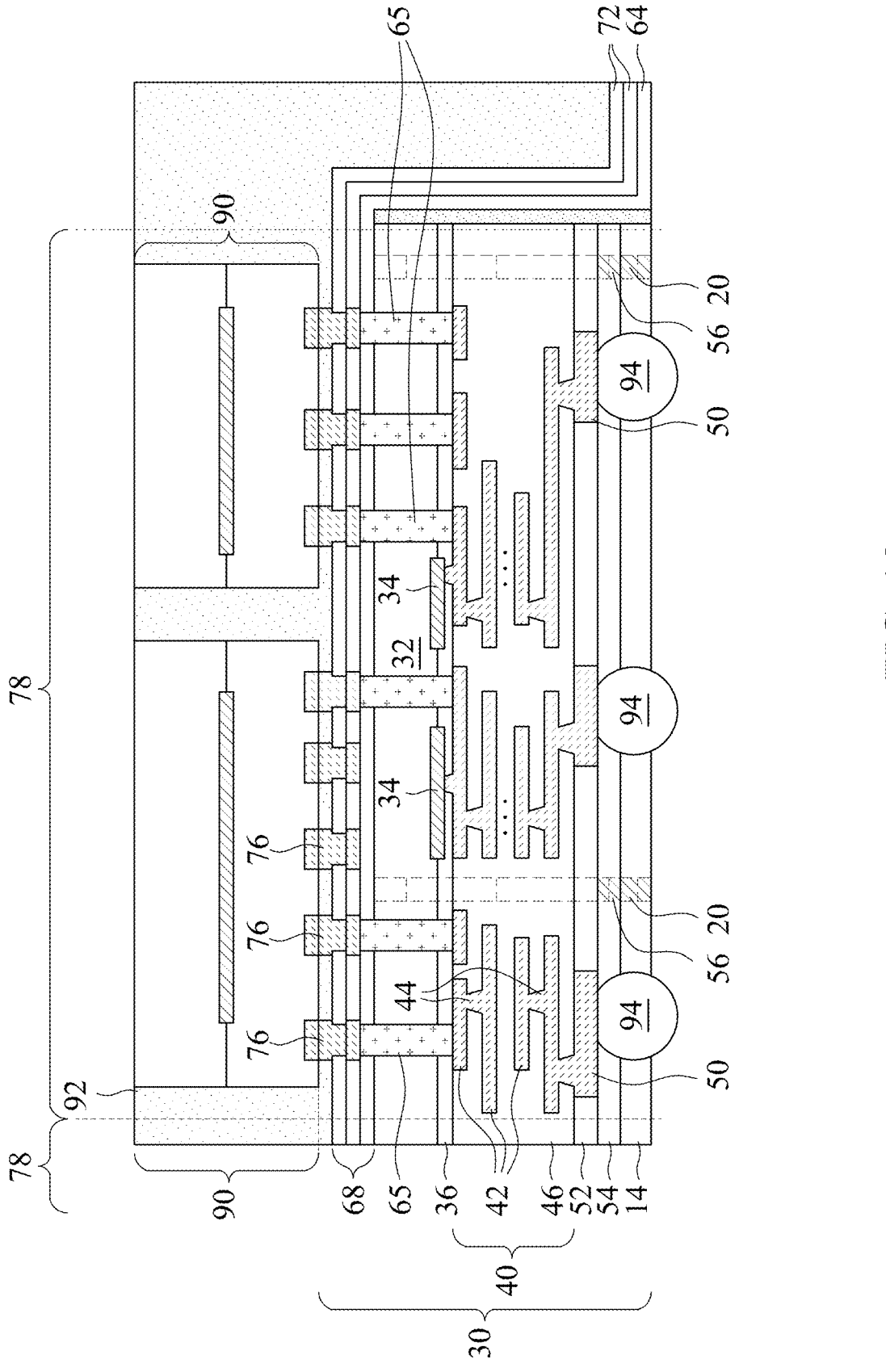

FIG. 16 illustrates the formation of package 80 in accordance with some embodiments. It is appreciated that package 80 may be packaged differently than shown in FIG. 16. For example, FIGS. 17 through 19 illustrates another packaging process. As shown in FIG. 16, package 78 may be attached to package component 82 through Thermal Interface Material (TIM) 84. The respective process is illustrated as process 234 in the process flow 200 as shown in FIG. 28. Package component 82 may be a package substrate, a frame, or the like. In accordance with some embodiments, device die 30 is electrically connected to package components 82 through bond wires 86.

FIGS. 17-19 and FIGS. 21-24 illustrate the wafer bond processes and the packaging processes in accordance with alternative embodiments. Unless specified otherwise, the materials and the formation processes of the components in these embodiments are essentially the same as the like components, which are denoted by like reference numerals in the preceding embodiments shown in FIGS. 1 through 16. The details regarding the formation processes and the materials of the components shown in FIGS. 17-24 may thus be found in the discussion of the preceding embodiments.

The initial steps of these embodiments are essentially the same as shown in FIGS. 1 through 13. Next, discrete device dies 90 are bonded to device dies 30' in device wafer 30. Each of device dies 30' may have one or more device dies 90 bonded thereon. Encapsulant 92 may be dispensed to encapsulate device dies 90. Encapsulant 92 may be a molding compound, a molding underfill, or the, like.

Next, substrate 12 is removed, for example, through CMP or a mechanical grinding process. The resulting structure is shown in FIG. 18. In accordance with some embodiments, after the removal of substrate 12, bond layer 14 and thermal conductive channels 20 are revealed. In accordance with alternative embodiments, bond layer 14 and thermal conductive channels 20 are also removed, and bond layer 54 and thermal conductive channels 56 are revealed.

As shown in FIG. 19, electrical connectors 94 are formed on the front side of device wafer 30. The formation process may include etching bond layer 54 (and bond layer 14 if it remains) to form openings, so that metal pads 50 are exposed, and forming electrical connectors 94 extending into the openings to electrically connect to metal pads 50. In subsequent processes, device wafer 30 and encapsulant 92 are singulated in a die-saw process to form discrete packages 78, each including one of device dies 30'. Protection layer 62 is removed by the die-saw process, and does not exist in the resulting packages 78.

Figure 20:
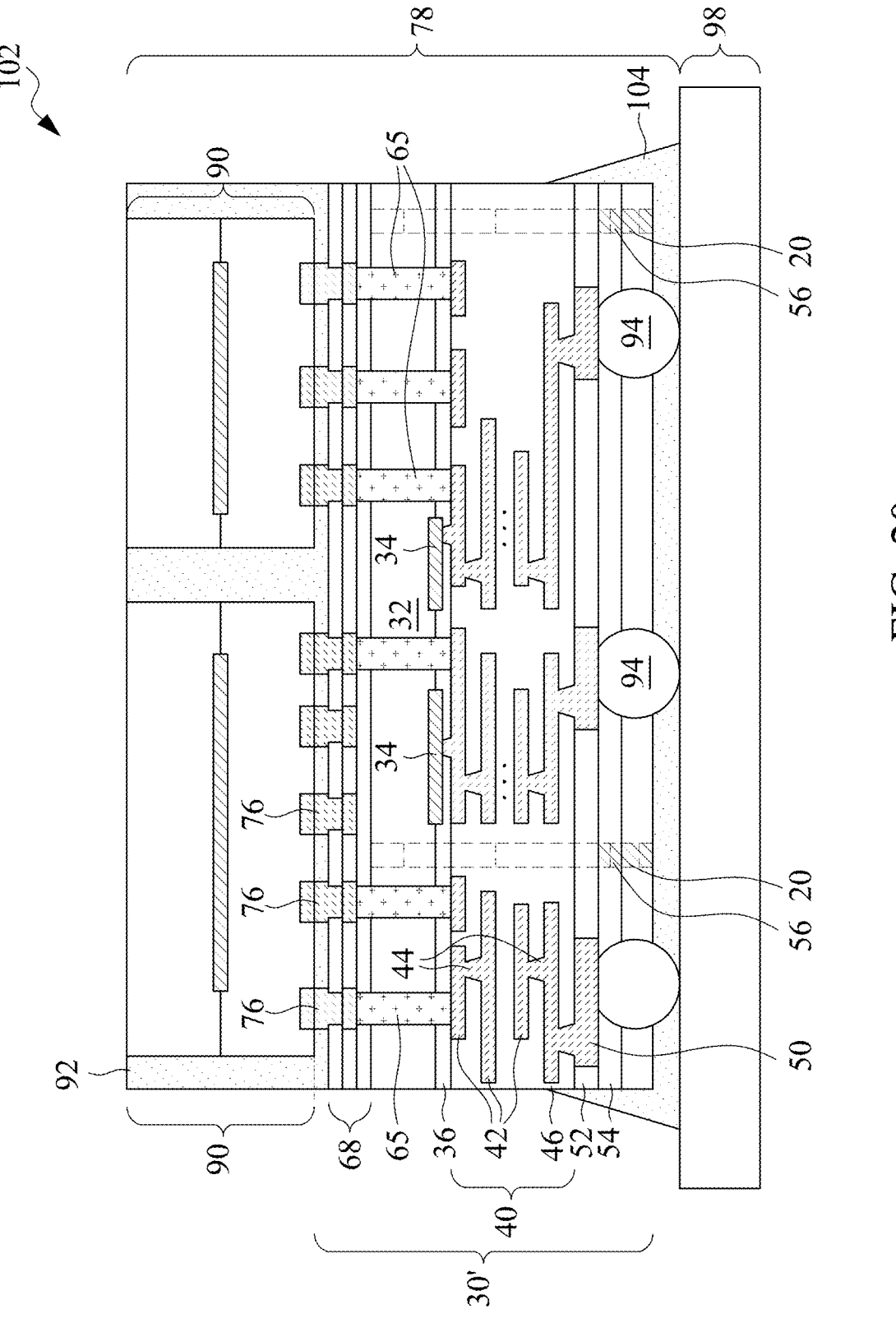

In FIG. 20, package 78 is bonded to package component 98 to form package 102. Package component 98 may be a package substrate, a printed circuit board, or the like. electrical connectors 94 electrically connect device die 30' to package component 98. Encapsulant 104 may be dispensed.

FIGS. 21 through 24 illustrate the wafer bonding process and the formation of a package in accordance with alternative embodiments. These embodiments are similar to the embodiments shown in FIGS. 1 through 16, except that metal films, rather than dielectric bond layers, are used for the wafer bonding.

Figure 21:
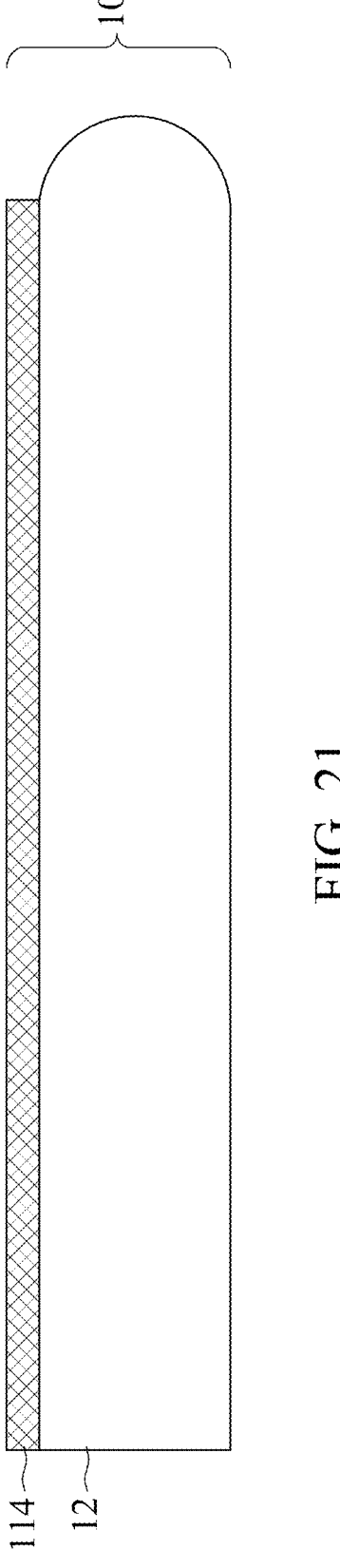
FIGS. 21-24 illustrate the intermediate stages in a wafer bonding process in accordance with some embodiments.

Referring to FIG. 21, carrier wafer 10 is formed. Carrier Wafer 10 may be similar to the carrier wafer 10 as shown in FIG. 1, except that instead of forming bond layer 14 as a dielectric layer, bond layer 114 is formed as a metal layer, which also has a thermal conductivity value greater than the thermal conductivity value of bond layer 14 and substrate 12. In accordance with some embodiments, bond layer 114 comprises copper, while other metallic materials such as tungsten, aluminum, nickel, or the like, or alloys thereof, may be used. Bond layer 114 may be a blanket film with no opening formed therein. The top view of bond layer 114 may be rounded.

Figure 22:
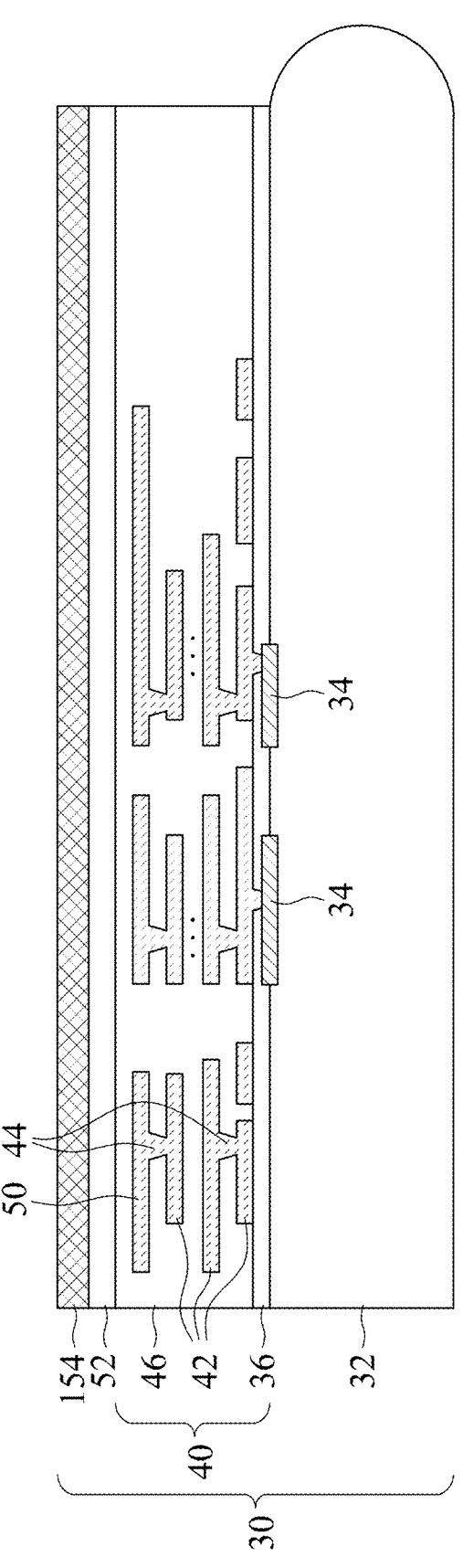

Referring to FIG. 22, device wafer 30 is formed. Device wafer 30 may be similar to the device wafer 30 as shown in FIG. 4, except that instead of forming bond layer 54 as a dielectric layer, bond layer 154 is formed as a metal layer, which also has a thermal conductivity value greater than the thermal conductivity value of bond layer 154, dielectric layers 36, 46 and 52, and substrate 32. In accordance with some embodiments, bond layer 154 comprises copper, while other metals such as tungsten, aluminum, nickel, or the like, or alloys thereof, may be used. Bond layers 114 and 154 may be formed of the same metal or different metals. Bond layer 154 may also be a blanket film with no opening formed therein. Different from the wafer 30 as shown in FIG. 4, There is no bond pads 50 formed to contact bond layer 154.

Figure 23:
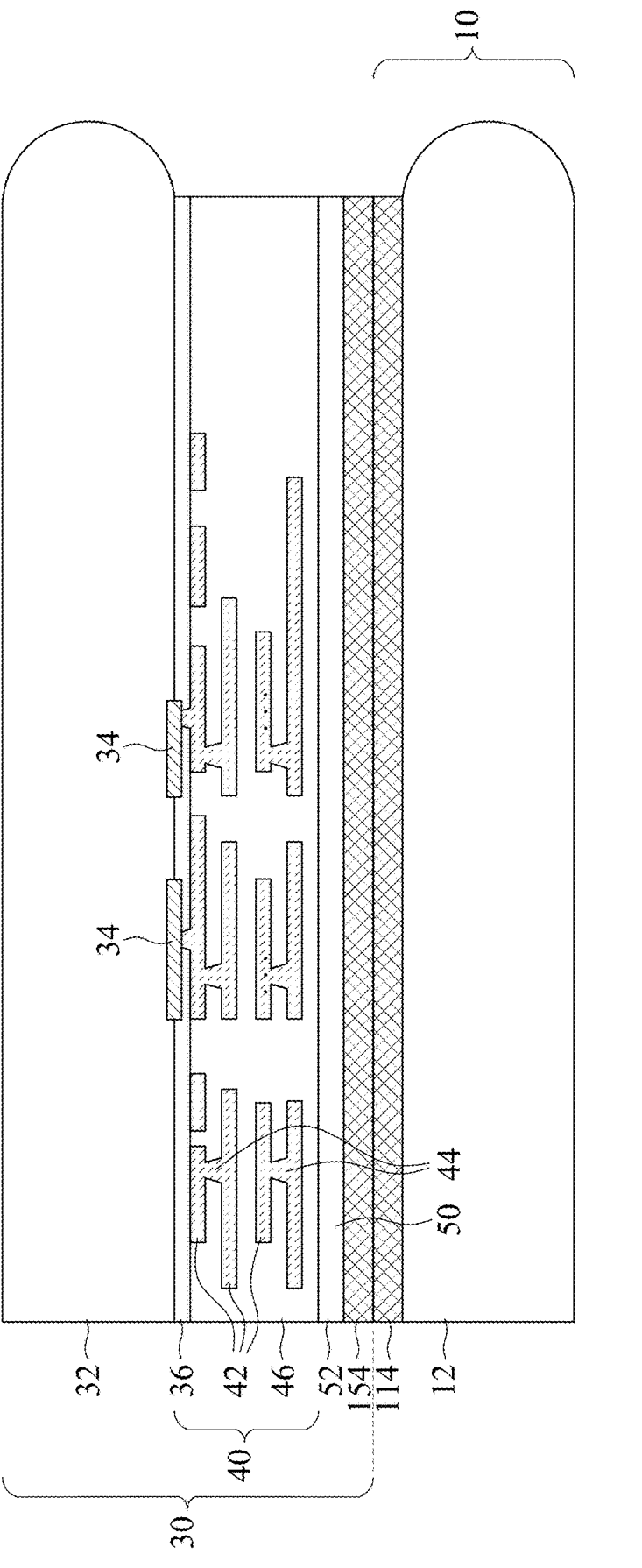
Figure 24:
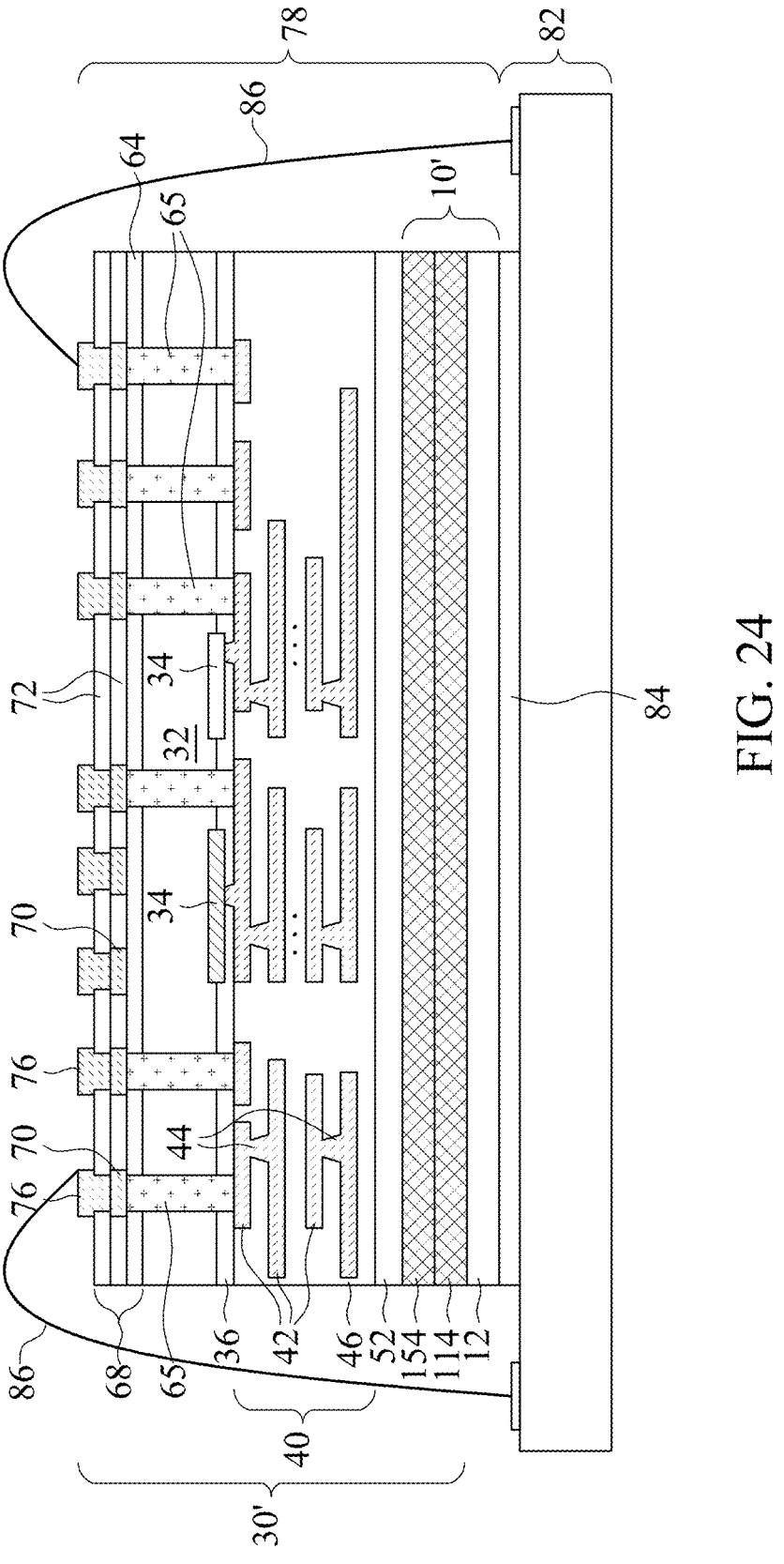

Referring to FIG. 23, device wafer 30 is bonded to carrier wafer 10 through direct metal-to-metal bonding. The bonding may be achieved by pressing device wafer 30 against carrier wafer 10, with bond layer 154 in physical contact with bond layer 114, and annealing device wafer 30 and carrier wafer 10, so that bond layers 114 and 154 are bonded together through the inter-diffusion of metals. The resulting structure is shown in FIG. 24. The subsequent processes are similar to the processes shown in FIGS. 8 through 16, and the details are not repeated herein. The resulting structure is shown in FIG. 24.

The embodiments of the present disclosure have some advantageous features. By forming thermal conductive channels in the carrier wafer and the device wafer, the thermal conductive channels may help the heat generated in the device dies (when they are powered on) to dissipate to the underlying structure such as the thermal interface material and the underlying package component. The heat dissipation is thus improved.

In accordance with some embodiments of the present disclosure, a method includes forming a first bond layer on a first wafer; forming a first thermal conductive channel extending into the first bond layer, wherein the first thermal conductive channel has a first thermal conductivity value higher than a second thermal conductivity value of the first bond layer; forming a second bond layer on a second wafer; forming a second thermal conductive channel extending into the second bond layer, wherein the second thermal conductive channel has a third thermal conductivity value higher than a fourth thermal conductivity value of the second bond layer; bonding the first wafer to the second wafer, wherein the first thermal conductive channel at least physically contacts the second thermal conductive channel; and forming an interconnect structure over the first wafer, wherein the interconnect structure is electrically connected to integrated circuit devices in the first wafer.

In an embodiment, the first bond layer is bonded to the second bond layer through fusion bonding, and the first thermal conductive channel and the second thermal conductive channel are bonded to each other through metal-to-metal direct bonding. In an embodiment, the first bond layer is bonded to the second bond layer through fusion bonding, and the first thermal conductive channel and the second thermal conductive channel are in physical contact with each other without being bonded to each other. In an embodiment, the method further comprises, before the interconnect structure is formed, performing a trimming process on the first wafer; depositing a protection layer contacting a sidewall of the first wafer; and removing a horizontal portion of the protection layer that overlaps the first wafer.

In an embodiment, the method further comprises forming a first plurality of additional thermal conductive channels in a same process as forming the first thermal conductive channel; and forming a second plurality of additional thermal conductive channels in a same process as forming the second thermal conductive channel, wherein the first plurality of additional thermal conductive channels are at least in physical contact with corresponding ones of the second plurality of additional thermal conductive channels. In an embodiment, the first plurality of additional thermal conductive channels are arranged as an array. In an embodiment, the first plurality of additional thermal conductive channels are interconnected to form an grid. In an embodiment, the first wafer comprises a first substrate, and wherein the first thermal conductive channel further extends into the first substrate.

In an embodiment, the method further comprises thinning the first substrate, wherein the first thermal conductive channel is exposed after the first substrate is thinned. In an embodiment, the method further comprises forming a dielectric layer on the first substrate, wherein the dielectric layer is in physical contact with the first thermal conductive channel. In an embodiment, the second wafer comprises a second substrate, and wherein the second thermal conductive channel further extends into the second substrate. In an embodiment, the method further comprises thinning the second wafer, wherein the second thermal conductive channel is exposed after the second wafer is thinned. In an embodiment, the method further comprises attaching a package component to the second wafer through a thermal interface material, wherein the second thermal conductive channel is in physical contact with the thermal interface material.

In accordance with some embodiments of the present disclosure, a structure includes a first device die comprising a semiconductor substrate; an interconnect structure underlying the semiconductor substrate; a first bond layer underlying the interconnect structure; and a first thermal conductive channel extending from a bottom surface of the first bond layer into the first bond layer; and a package component underlying the first device die and thermally coupled to the first device die. In an embodiment, the structure further comprises a second bond layer underlying and bonding to the first bond layer; and a second thermal conductive channel extending from a top surface of the second bond layer into the second bond layer, wherein the second thermal conductive channel is in physical contact with the first thermal conductive channel. In an embodiment, the second thermal conductive channel is not bonded to the first thermal conductive channel. In an embodiment, the second thermal conductive channel is bonded to the first thermal conductive channel through metal-to-metal direct bonding.

In accordance with some embodiments of the present disclosure, a structure includes a first device die comprising a first semiconductor substrate; an interconnect structure underlying the first semiconductor substrate; a first bond layer underlying the interconnect structure; a first thermal conductive channel extending into the first bond layer; a second bond layer underlying and bonding to the first bond layer; and a second thermal conductive channel extending into the second bond layer, wherein the second thermal conductive channel is bonded to the first thermal conductive channel; a thermal interface material underlying the second bond layer and the second thermal conductive channel; and a package component underlying and contacting the thermal interface material. In an embodiment, the structure further comprises a second semiconductor substrate underlying the second bond layer, wherein the second thermal conductive channel physically contacts the second semiconductor substrate. In an embodiment, the second thermal conductive channel further penetrates through the second semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first bond layer on a first wafer;
forming a first thermal conductive channel extending into the first bond layer, wherein the first thermal conductive channel has a first thermal conductivity value higher than a second thermal conductivity value of the first bond layer, wherein a part of the first thermal conductive channel is outside of the first bond layer;
forming a second bond layer on a second wafer;
forming a second thermal conductive channel extending into the second bond layer, wherein the second thermal conductive channel has a third thermal conductivity value higher than a fourth thermal conductivity value of the second bond layer;
bonding the first wafer to the second wafer, wherein the first thermal conductive channel at least physically contacts the second thermal conductive channel; and
forming an interconnect structure over the first wafer, wherein the interconnect structure is electrically connected to integrated circuit devices in the first wafer, and wherein the first thermal conductive channel and the second thermal conductive channel are electrically decoupled from the integrated circuit devices of the first wafer.

2. The method of claim 1, wherein the first bond layer is bonded to the second bond layer through fusion bonding, and the first thermal conductive channel and the second thermal conductive channel are bonded to each other through metal-to-metal direct bonding.

3. The method of claim 1, wherein the first bond layer is bonded to the second bond layer through fusion bonding, and the first thermal conductive channel and the second thermal conductive channel are in physical contact with each other without being bonded to each other.

4. The method of claim 1 further comprising, before the interconnect structure is formed:
performing a trimming process on the first wafer;
depositing a protection layer contacting a sidewall of the first wafer; and
removing a horizontal portion of the protection layer that overlaps the first wafer.

5. The method of claim 1 further comprising:
forming a first plurality of additional thermal conductive channels in a same process as forming the first thermal conductive channel; and
forming a second plurality of additional thermal conductive channels in a same process as forming the second thermal conductive channel, wherein the first plurality of additional thermal conductive channels are at least in physical contact with corresponding ones of the second plurality of additional thermal conductive channels.

6. The method of claim 5, wherein the first plurality of additional thermal conductive channels are arranged as an array.

7. The method of claim 1, wherein the first wafer comprises a first substrate, and wherein the first thermal conductive channel further extends into the first substrate.

8. The method of claim 7 further comprising thinning the first substrate, wherein the first thermal conductive channel is exposed after the first substrate is thinned.

9. The method of claim 7 further comprising forming a dielectric layer on the first substrate, wherein the dielectric layer is in physical contact with the first thermal conductive channel.

10. The method of claim 1, wherein the second wafer comprises a second substrate, and wherein the second thermal conductive channel further extends into the second substrate.

11. The method of claim 10 further comprising thinning the second wafer, wherein the second thermal conductive channel is exposed after the second wafer is thinned.

12. The method of claim 10 further comprising attaching a package component to the second wafer through a thermal interface material, wherein the second thermal conductive channel is in physical contact with the thermal interface material.

13. A method comprising:

forming a first device die comprising:

a semiconductor substrate;

an interconnect structure underlying the semiconductor substrate;

a first bond layer underlying the interconnect structure; and a first thermal conductive channel extending from a bottom surface of the first bond layer into the semiconductor substrate, wherein the first thermal conductive channel is electrically floating; and bonding a package component underlying the first device die and thermally coupled to the first device die.

14. The method of claim 13 further comprising:

before the package component is bonded underlying the first device die, forming a second bond layer on the package component, wherein the first bond layer is bonded to the second bond layer; and before the package component is bonded underlying the first device die, forming a second thermal conductive channel extending from a top surface of the second bond layer into the second bond layer, wherein the second thermal conductive channel is vertically aligned to the first thermal conductive channel.

15. The method of claim 14, wherein the second thermal conductive channel is bonded to the first thermal conductive channel through metal-to-metal direct bonding.

16. A method comprising:

forming a device die comprising:

a first semiconductor substrate;

an interconnect structure underlying the first semiconductor substrate;

a first bond layer underlying the interconnect structure;

a first thermal conductive channel in the first bond layer;

bonding a first package component to the device die, wherein the first package component comprises:

a second bond layer underlying and joined to the first bond layer; and a second thermal conductive channel in the second bond layer, wherein the second thermal conductive channel is joined to the first thermal conductive channel, and wherein the first thermal conductive channel and the second thermal conductive channel are electrically floating; and attaching the first package component to a second package component through a thermal interface material.

17. The method of claim 16, wherein the first package component further comprises:

a second semiconductor substrate, wherein the second thermal conductive channel physically contacts the second semiconductor substrate.

18. The method of claim 17, wherein the second thermal conductive channel further penetrates through the second semiconductor substrate.

19. The method of claim 13, wherein the first thermal conductive channel comprises a straight sidewall, and wherein the straight sidewall continuously extends from the bottom surface of the first bond layer into the semiconductor substrate.

20. The method of claim 1, wherein the first thermal conductive channel comprises a grid that comprises:

a first plurality of conductive channels with first lengthwise directions parallel to each other; and a second plurality of conductive channels with second lengthwise directions parallel to each other and perpendicular to the first lengthwise directions, wherein the first plurality of conductive channels are physically joined to the second plurality of conductive channels to form a continuous structure.

* * * * *